United States Patent
Son et al.

(10) Patent No.: US 11,329,053 B2
(45) Date of Patent: May 10, 2022

(54) SEMICONDUCTOR DEVICES INCLUDING ENLARGED CONTACT HOLE AND METHODS OF FORMING THE SAME

(71) Applicant: Samsung Electronics Co., Ltd., Suwon-si (KR)

(72) Inventors: Yoon Ho Son, Hwaseong-si (KR); Jae Uk Shin, Suwon-si (KR); Yong Sun Ko, Suwon-si (KR); Im Soo Park, Seongnam-si (KR); Sung Yoon Chung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/146,577

(22) Filed: Jan. 12, 2021

(65) Prior Publication Data

US 2021/0134809 A1    May 6, 2021

Related U.S. Application Data

(63) Continuation of application No. 16/571,415, filed on Sep. 16, 2019, now Pat. No. 10,916,549, which is a
(Continued)

(30) Foreign Application Priority Data

May 25, 2017   (KR) .................. 10-2017-0064665

(51) Int. Cl.
  *H01L 21/768*   (2006.01)
  *H01L 27/108*   (2006.01)
(Continued)

(52) U.S. Cl.
  CPC .... *H01L 27/10885* (2013.01); *H01L 21/0217* (2013.01); *H01L 21/02164* (2013.01);
(Continued)

(58) Field of Classification Search
  None
  See application file for complete search history.

(56) References Cited

U.S. PATENT DOCUMENTS 8,115,311 B2   2/2012   Paik
8,860,110 B2   10/2014  Lee
(Continued)

FOREIGN PATENT DOCUMENTS

CN   103633093 A  *  3/2014  ....... H01L 27/10897
JP   4278333 B2       6/2009
(Continued)

*Primary Examiner* — Telly D Green
(74) *Attorney, Agent, or Firm* — Myers Bigel, P.A.

(57) ABSTRACT

Semiconductor devices and methods of forming the same are provided. The methods may include forming first and second line patterns. The first line pattern has a first side facing the second line pattern, and the second line pattern has a second side facing the first line pattern. The methods may also include forming a first spacer structure on the first side of the first line pattern and a second spacer structure on the second side of the second line pattern. The first and the second spacer structures may define an opening. The methods may further include forming a first conductor in a lower part of the opening, forming an expanded opening by etching upper portions of the first and second spacer structures, and forming a second conductor in the expanded opening. The expanded opening may have a width greater than a width of the lower part of the opening.

20 Claims, 31 Drawing Sheets

Related U.S. Application Data continuation of application No. 15/861,950, filed on Jan. 4, 2018, now Pat. No. 10,418,366.

(51) Int. Cl.
*H01L 21/311* (2006.01)
*H01L 21/02* (2006.01)

(52) U.S. Cl.
CPC .. *H01L 21/31111* (2013.01); *H01L 21/76816* (2013.01); *H01L 21/76843* (2013.01); *H01L 21/76877* (2013.01); *H01L 27/10888* (2013.01); *H01L 27/10814* (2013.01); *H01L 27/10823* (2013.01)

(56) References Cited

U.S. PATENT DOCUMENTS

| | | | |
|---|---|---|---|
| 9,496,223 B2 | 11/2016 | Lee et al. | |
| 10,008,505 B2 | 6/2018 | Lee et al. | |
| 10,037,999 B2 | 7/2018 | Kim et al. | |
| 10,217,747 B2* | 2/2019 | Kim | H01L 27/10814 |
| 2007/0077702 A1 | 4/2007 | Cheng et al. | |
| 2011/0183512 A1 | 7/2011 | Cho et al. | |
| 2013/0256769 A1* | 10/2013 | Jeong | H01L 27/1052 |
| | | | 257/296 |
| 2013/0292847 A1 | 11/2013 | Choi et al. | |
| 2014/0299989 A1 | 10/2014 | Lim et al. | |
| 2016/0086955 A1 | 3/2016 | Wu | |
| 2016/0197042 A1 | 7/2016 | Lee et al. | |
| 2017/0018553 A1 | 1/2017 | Lee et al. | |
| 2017/0076974 A1 | 3/2017 | Choi et al. | |
| 2017/0243922 A1 | 8/2017 | Eun | |
| 2020/0013668 A1 | 1/2020 | Choi et al. | |

FOREIGN PATENT DOCUMENTS

| | | |
|---|---|---|
| KR | 20130123687 A | 11/2013 |
| KR | 20140086648 A | 7/2014 |
| KR | 20150088635 A | 8/2015 |
| KR | 20160021962 A | 2/2016 |

* cited by examiner

SEMICONDUCTOR DEVICES INCLUDING ENLARGED CONTACT HOLE AND METHODS OF FORMING THE SAME

CROSS-REFERENCE TO RELATED APPLICATION

This application is a continuation of U.S. patent application Ser. No. 16/571,415, filed Sep. 16, 2019, now allowed, which is a continuation of U.S. patent application Ser. No. 15/861,950, filed Jan. 4, 2018, now U.S. Pat. No. 10,418,366, which claims the benefit of Korean Patent Application No. 10-2017-0064665, filed on May 25, 2017, in the Korean Intellectual Property Office, the disclosure of which is incorporated herein by reference in its entirety.

BACKGROUND

The present disclosure relates to semiconductor devices including an enlarged contact hole and methods of forming the same.

For high density, low power consumption, and high operating speed, elements of a semiconductor device are becoming smaller, and thus defects due to slight misalignment or a process variation in, for example, a deposition process or an etching process are increasing. Accordingly, developing manufacturing processes for securing a sufficient process margin may be beneficial and may improve reliability of semiconductor devices.

SUMMARY

According to embodiments of the present disclosure, highly integrated semiconductor devices with improved reliability and methods of manufacturing the same are provided.

According to embodiments of the present disclosure, a method of forming a semiconductor device may include forming a plurality of line patterns on a substrate. The plurality of line patterns may include a first line pattern and a second line pattern directly adjacent the first line pattern, the first line pattern may have a first side facing the second line pattern, and the second line pattern may have a second side facing the first line pattern. The method may also include forming a first spacer structure on the first side of the first line pattern and a second spacer structure on the second side of the second line pattern. The first spacer structure and the second spacer structure may define an opening therebetween. The method may further include forming a first conductor in a lower part of the opening, forming an expanded opening by etching upper portions of the first and second spacer structures, and forming a second conductor in the expanded opening on the first conductor. An upper surface of the first conductor may be lower than upper surfaces of the first and second line patterns. The expanded opening may have a width greater than a width of the lower part of the opening. After etching the upper portions of the first and second spacer structures, an upper surface of the first spacer structure may include a recessed portion, and a portion of the second conductor may be formed in the recessed portion of the upper surface of the first spacer structure such that a width of the second conductor may be greater than a width of the first conductor.

According to embodiments of the present disclosure, a method of forming a semiconductor device may include forming a plurality of line patterns on a substrate. The plurality of line patterns may include a first line pattern and a second line pattern directly adjacent the first line pattern, the first line pattern may have a first side facing the second line pattern, and the second line pattern may have a second side facing the first line pattern. The method may also include forming a first spacer structure on the first side of the first line pattern and a second spacer structure on the second side of the second line pattern. The first spacer structure and the second spacer structure may define an opening therebetween. The method may further include forming a first conductor in a lower part the opening, forming an expanded opening by etching upper portions the first and second spacer structures, and forming a second conductor in the expanded opening on the first conductor. An upper surface of the first conductor may be lower than upper surfaces of the first and second line patterns. The expanded opening may have a width greater than a width of the lower part of the opening. After forming the expanded opening, upper surfaces of the first and second spacer structures may be substantially flat, the second conductor may overlap the upper surfaces of the first and second spacer structures, and a width of the second conductor may be greater than a width of the first conductor. Etching the upper portions the first and second spacer structures may include performing a wet etching process using an etchant having a pH of about 3 or less and an etch selectivity of an oxide film to a nitride film of 10:1 or less.

According to embodiments of the present disclosure, a method of forming a semiconductor device may include forming a plurality of line patterns on a substrate. The plurality of line patterns may include a first line pattern and a second line pattern directly adjacent the first line pattern, the first line pattern may have a first side facing the second line pattern, and the second line pattern may have a second side facing the first line pattern. The method may also include forming a first spacer structure on the first side of the first line pattern and a second spacer structure on the second side of the second line pattern. The first spacer structure and the second spacer structure may define an opening therebetween. The method may further include forming a first conductor in a lower part of the opening, forming an expanded opening by etching upper portions of the first and second spacer structures, and forming a second conductor in the expanded opening on the first conductor. An upper surface of the first conductor may be lower than upper surfaces of the first and second line patterns. The expanded opening may have a width greater than a width of the lower part of the opening. After etching the upper portions of the first and second spacer structures, upper surfaces of the first and second spacer structures may define the expanded opening and may be disposed higher than the upper surface of the first conductor. The second conductor may overlap the upper surfaces of the first and second spacer structures such that a width of the second conductor may be greater than a width of the first conductor.

BRIEF DESCRIPTION OF THE DRAWINGS

The above and other objects, features and advantages of the present disclosure will become more apparent to those of ordinary skill in the art by describing example embodiments thereof in detail with reference to the accompanying drawings, in which.

DETAILED DESCRIPTION

As used herein the term "and/or" includes any and all combinations of one or more of the associated listed items.

It will be understood that "an element A covers a surface of an element B" (or similar language) means that the element A is on the surface of the element B but does not necessarily mean that the element A covers the surface of the element B entirely. It will be also understood that "a first one and a second one of a plurality of elements are directly adjacent each other" (or similar language) means that none of the plurality of elements is disposed between the first and second ones of the plurality of elements but does not necessarily mean that nothing is disposed between the first and second ones of the plurality of elements.

Figure 1A:
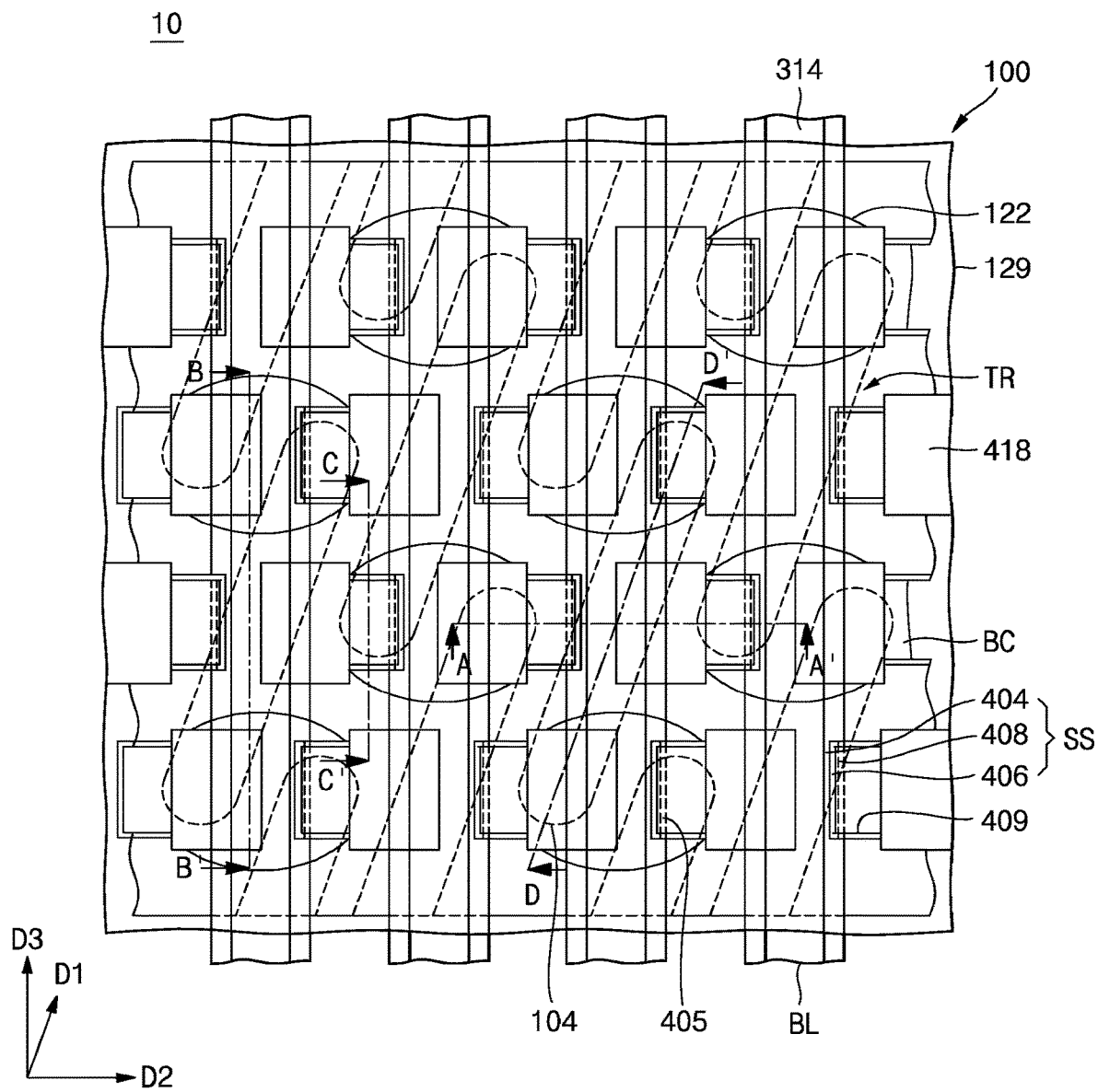
FIG. 1A is a plan view schematically illustrating a structure of a semiconductor device according to one embodiment of the present disclosure.
Figure 1B:
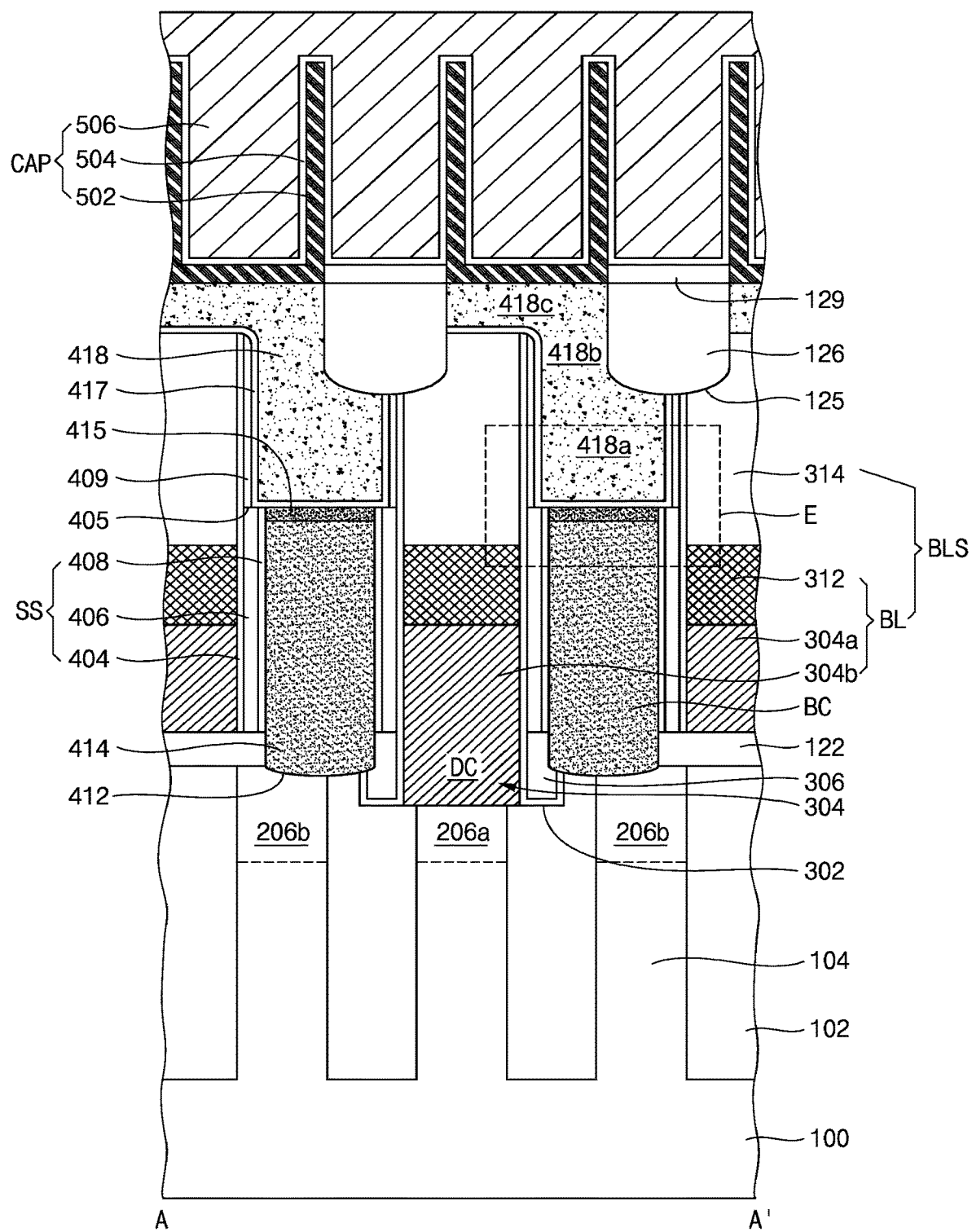
FIGS. 1B, 1C, 1D and 1E are cross-sectional views taken along the lines A-A', B-B', C-C', and D-D' of FIG. 1A, respectively.
Figure 1C:
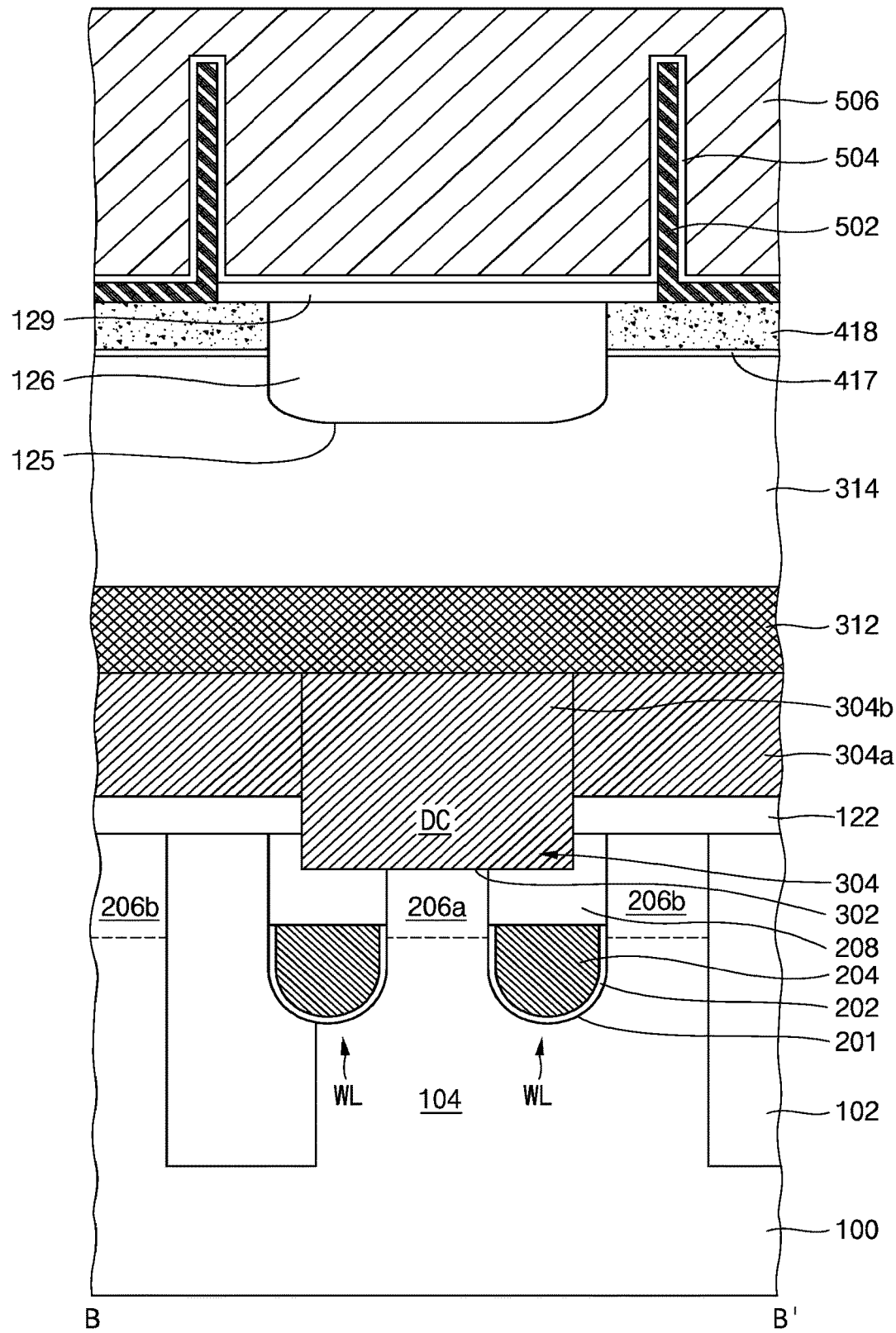
Figure 1D:
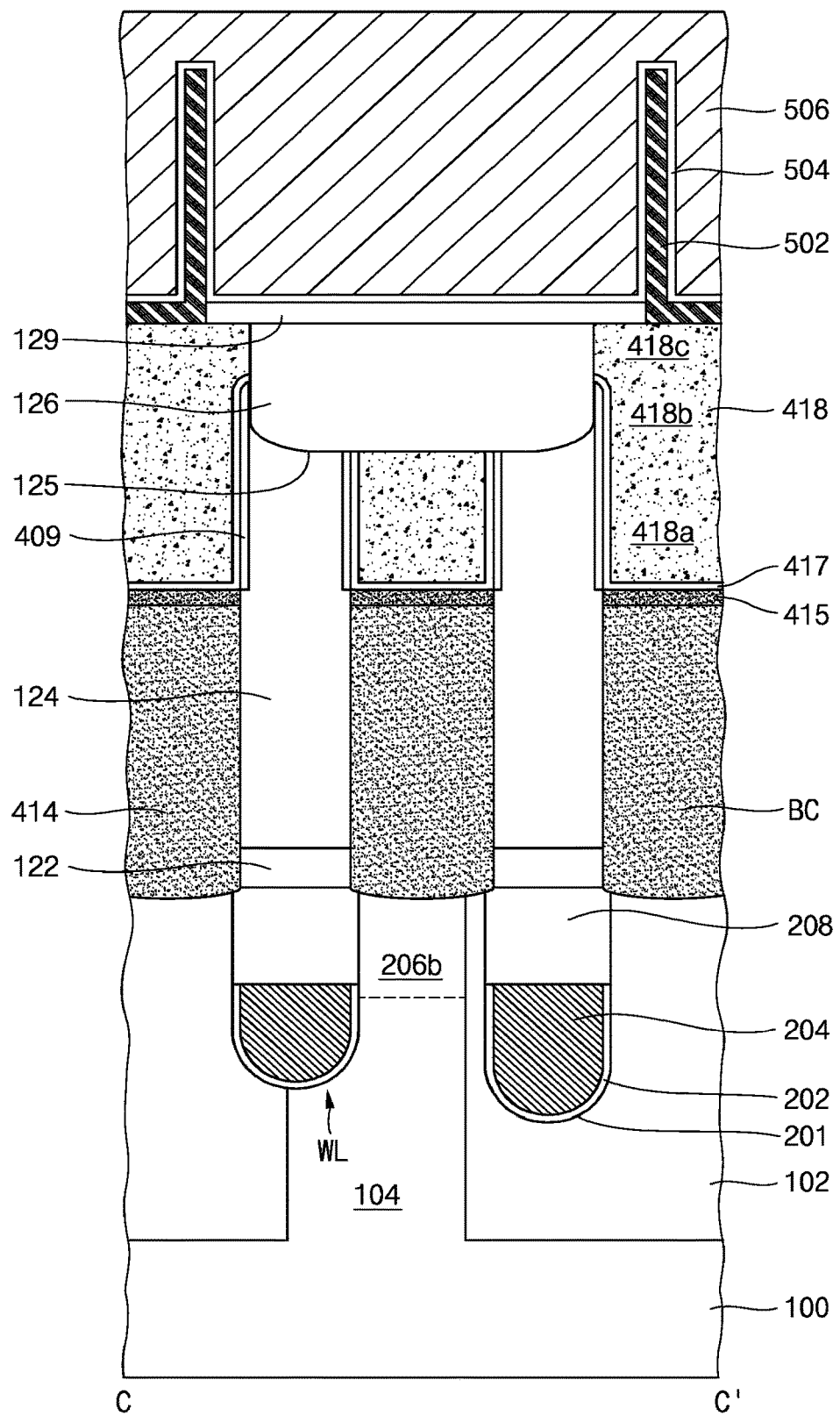
Figure 1E:
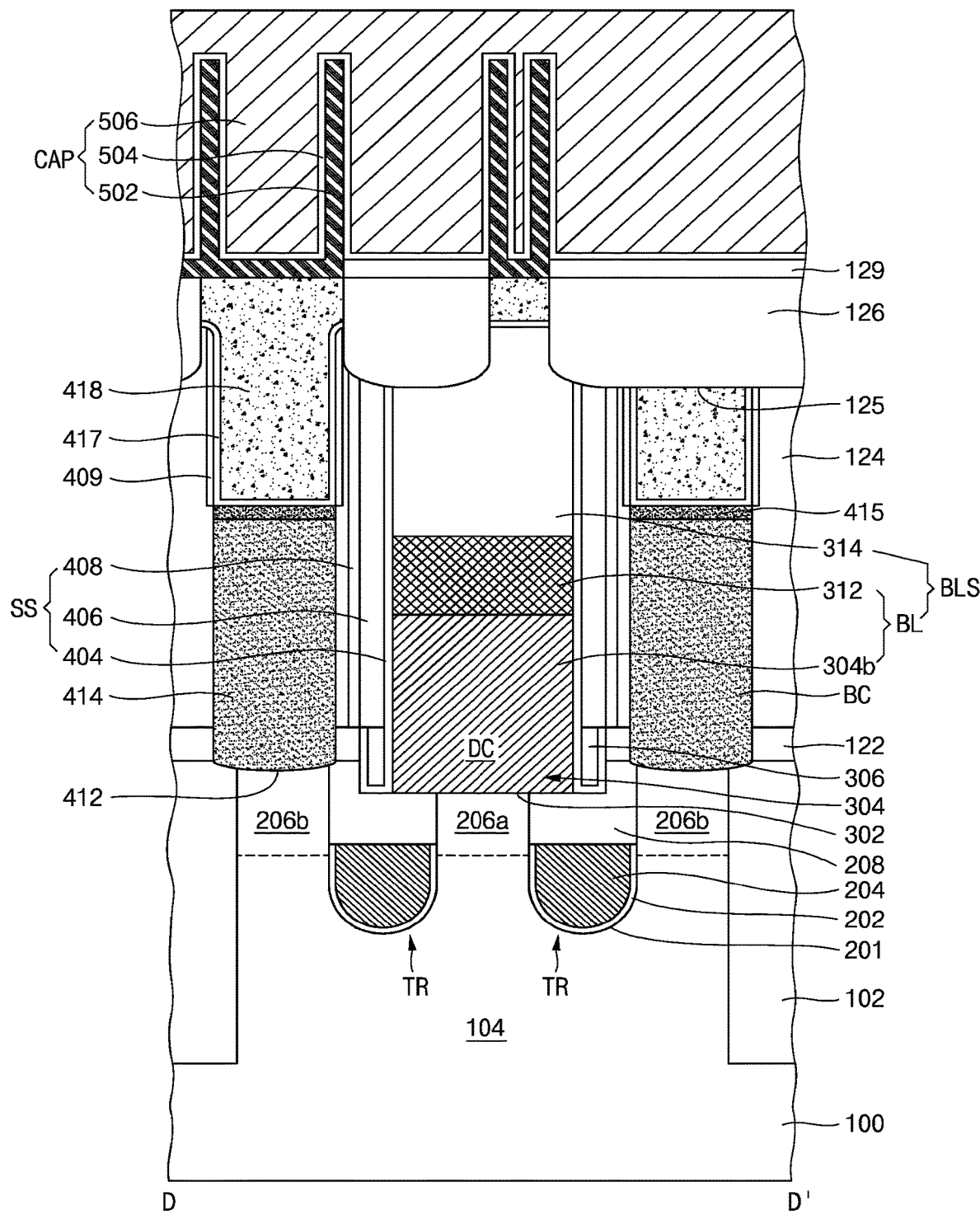

FIG. 1A is a plan view schematically illustrating a structure of a semiconductor device according to one embodiment of the present disclosure. FIG. 1B is a cross-sectional view taken along the line A-A' of FIG. 1A. FIG. 1C is a cross-sectional view taken along the line B-B' of FIG. 1A. FIG. 1D is a cross-sectional view taken along the line C-C' of FIG. 1A. FIG. 1E is a cross-sectional view taken along the line D-D' of FIG. 1A. The semiconductor device according to one embodiment of the present disclosure may include a dynamic random access memory (DRAM). Herein, "one embodiment" may refer to one of various embodiments, types, perspectives or aspects of the present disclosure.

Referring to FIGS. 1A through 1E, a semiconductor device 10 according to one embodiment of the present disclosure may include a transistor TR formed on a substrate 100, a first contact part DC, a bit line structure BLS, a second contact part BC, and a capacitor CAP.

The substrate 100 may be provided as a lower part of the semiconductor device 10. The substrate 100 may be a semiconductor substrate or a compound semiconductor substrate which includes silicon, germanium, silicon-germanium, or the like. In one embodiment, the substrate 100 may be a p-type semiconductor substrate. The substrate 100 may include an isolation region 102 and an active region 104. The isolation region 102 may be a region in which an insulating material is buried in the vicinity of the active region 104. The insulating material may include, for example, a silicon oxide, a silicon nitride, and/or a silicon oxynitride. The active region 104 may be an isolated region of the substrate 100 surrounded by the isolation region 102. In one embodiment, the active region 104 may be formed in a shape and pattern as illustrated in FIG. 1A. In one embodiment, the active region 104 may extend longitudinally in a first direction D1 in a plan view as illustrated in FIG. 1A.

Transistors TR may be formed in the active region 104. Each of the transistors TR may include a gate insulating film 202, a gate electrode 204, a gate capping film 208, a first impurity region 206a, and a second impurity region 206b.

In one embodiment, recessed regions 201 may be formed in the substrate 100 to form the transistors TR. The recessed regions 201 may have a line shape having a certain width in a second direction D2. In one embodiment, a pair of recessed regions 201 may be formed in a single active region 104. In one embodiment, each of the pair of recessed regions 201 may be formed at one of opposing edge portions of the active region 104. The gate insulating film 202 may be formed on an inner side surface of each of the recessed regions 201. The gate insulating film 202 may include an insulating material such as silicon oxide or silicon oxynitride, or a metal oxide such as hafnium oxide, aluminum oxide or zirconium oxide. The gate electrode 204 may be provided on the gate insulating film 202.

In one embodiment, the gate electrode 204 may be buried in a lower part of the recessed region 201 as illustrated in FIGS. 1C and 1D. The gate electrode 204 may include a conductive material, e.g., impurity-doped polysilicon, a metal such as tungsten, or a metal compound such as titanium nitride. In one embodiment, a pair of gate electrodes 204 may be formed in a single active region 104. In one embodiment, each of the pair of gate electrodes 204 may be formed at one of the opposing edge portions of the active region 104. The gate electrode 204 may form a word line WL.

The gate capping film 208 may be provided on the gate electrode 204. In one embodiment, an upper part of the recessed region 201 may be filled with the gate capping film 208 as illustrated in FIGS. 1C and 1D. The gate capping film 208 may include the above-mentioned insulating material (e.g., a silicon oxide, a silicon nitride, and/or a silicon oxynitride). In one embodiment, the gate capping film 208 may be a nitride film.

In one embodiment, the first impurity region 206a may be located at a center portion of the active region 104 between the pair of gate electrodes 204. The second impurity region 206b may be formed at one of the opposing edge portions of the active region 104, which is opposite the first impurity region 206a with respect to one of the pair of gate electrodes 204. The first and second impurity regions 206a and 206b may be doped with n-type impurities. The first and second impurity regions 206a and 206b may function as a source region and/or a drain region.

A first interlayer insulating film 122 may be formed on the substrate 100 including the transistors TR. The first interlayer insulating film 122 may be a single film or a multi-layered film including the insulating material described above. In one embodiment, each of the first interlayer insulating film 122 may be patterned in the form of an isolated island having roughly an oval shape on a region overlapping both second impurity regions 206b of two adjacent active regions 104. In one embodiment, first interlayer insulating film 122 may be planarly formed in a planar shape and pattern as illustrated in FIG. 1A.

The first contact part DC may be formed on the first impurity region 206a of the active region 104. The first contact part DC may form a direct contact that may electrically connect a bit line BL, which will be described below, and the first impurity region 206a of the active region 104.

The first contact part DC may include a first contact plug 304 provided in a first contact hole 302 and an insulating spacer 306.

The first contact hole 302 may be formed by etching a region of the substrate 100 excluding the pattern of the first interlayer insulating film 122. The first contact hole 302 may be formed in a region of the active region 104 including the first impurity region 206a to expose the first impurity region 206a. In one embodiment, the first contact hole 302 may extend into a portion of the first impurity region 206a of the active region 104, a portion of the isolation region 102 adjacent to the first impurity region 206a, and a portion of the gate capping film 208, and thus a lower end part of the first contact hole 302 may be at a lower level than an upper surface of the substrate 100 as illustrated in FIG. 1B.

The first contact plug 304 may be buried in the first impurity region 206a exposed to the first contact hole 302 to be electrically connected to the first impurity region 206a. In one embodiment, the first contact plug 304 may be formed in roughly a bar shape between two adjacent first interlayer insulating films 122 in a third direction D3. A lower part of the first contact plug 304 may be insulated from the gate electrode 204 by the gate capping film 208. The first contact plug 304 may include the conductive material described above. In one embodiment, the first contact plug 304 may include impurity-doped polysilicon.

The insulating spacer 306 may be located between an inner side surface of the first contact hole 302 and the first contact plug 304. The insulating spacer 306 may be formed by burying an insulating material in the first contact hole 302 to surround two outer side surfaces of the first contact plug 304 in the second direction D2. The insulating spacer 306 may insulate the first contact plug 304 and the second contact part BC adjacent to the first contact plug 304 from each other. In one embodiment, an upper surface of the insulating spacer 306 may be substantially coplanar with an upper surface of the first interlayer insulating film 122. The insulating spacer 306 may include the insulating material described above. In one embodiment, the insulating spacer 306 may be a nitride film.

The bit line structure BLS may be provided on the first contact part DC. The bit line structure BLS may have a stacked structure in which the bit line BL and a hard mask pattern 314 are sequentially stacked. The bit line structure BLS may be a line pattern according to one embodiment of the present disclosure.

The bit line BL may be formed to pass through over the first impurity region 206a of the active region 104. In one embodiment, a portion of the bit line BL may overlap the first impurity region 206a of the active region 104 as illustrated in FIG. 1A. Bit lines BL may have a line shape having a certain width and arranged in parallel in the third direction D3 crossing word lines WL. The bit line BL may have a single-layer structure or a multi-layered structure. In one embodiment, the bit line BL may include polysilicon layers 304a and 304b and a metal-containing layer 312 which are sequentially stacked. The polysilicon layers 304a and 304b may each include impurity-doped polysilicon. The metal-containing layer 312 may include a metal such as tungsten, titanium, or tantalum, or a conductive metal nitride such as a nitride including tungsten, titanium, or tantalum. The polysilicon layers 304a and 304b may include a first polysilicon pattern 304a disposed on the first interlayer insulating film 122 and a second polysilicon pattern 304b disposed on the first impurity region 206a of the active region 104. The first contact plug 304 may be integrally formed with a lower part of the second polysilicon pattern 304b. In one embodiment, the first contact plug 304 and the lower part of the second polysilicon pattern 304b may be formed concurrently using the same process such that an interface therebetween may not be visible. Thus, the bit line BL may form a conductive line electrically connecting a plurality of first contact plugs 304 buried in first contact holes 302 in the third direction D3. The bit line BL may be electrically connected to the first impurity region 206a of the transistor TR via the first contact plug 304.

The hard mask pattern 314 may be disposed on the bit line BL. Hard mask patterns 314 may extend in parallel to the bit lines BL in the third direction D3. The hard mask pattern 314 may include the insulating material described above. In one embodiment, the hard mask pattern 314 may be a nitride film.

Spacer structures SS insulating the bit line BL and the second contact part BC from each other may be arranged on opposite side surfaces of the bit line structure BLS. Spacer structures SS according to one embodiment of the present disclosure will be described with reference to FIGS. 2A to 2E below. In one embodiment, each of the spacer structures SS may include three layers 404, 406, and 408 as illustrated in FIG. 1B.

Insulating fences 124 may be arranged between the hard mask patterns 314. The insulating fence 124 may be arranged on the first interlayer insulating film 122, which overlaps the word line WL, in the second direction D2, when viewed from the plan view. As illustrated in FIG. 1D, the insulating fence 124 may vertically overlap the word line WL. The insulating fence 124 may be connected to the spacer structures SS formed on opposite side surfaces of two adjacent bit line structures BLS. The insulating fence 124 and the spacer structure SS may insulate the second contact parts BC, which will be described below, from each other. The insulating fence 124 may include the insulating material described above. In one embodiment, the insulating fence 124 may be a nitride film.

A second contact hole 412 may be formed in a space surrounded by the hard mask patterns 314 and the insulating fences 124. The second contact hole 412 may be an opening according to one embodiment of the present disclosure. The second contact hole 412 may be formed in the space surrounded by the hard mask patterns 314 and the insulating fences 124 to expose the second impurity region 206b of the active region 104 while extending through the first interlayer insulating film 122. A lower end part of the second contact hole 412 may extend through the first interlayer insulating film 122, a portion of a side surface of the insulating spacer 306, and portions of upper parts of the active region 104 and the isolation region 102. The lower end part of the second contact hole 412 may be at a lower level than the upper surface of the substrate 100 as illustrated in FIG. 1B.

A upper part of the second contact hole 412 may include an expansion part 405. In one embodiment, the expansion part 405 may have a width in the second direction D2 that is greater than a width of the lower part of the second contact hole 412 in the second direction D2, as illustrated in FIG. 1B. As will be discussed below, in one embodiment, the expansion part 405 may be formed by removing upper portions of the spacer structures SS, and the upper part of the second contact hole 412 is expanded to form the expansion part 405. Accordingly, it will be understood that the expansion part 405 can be referred to as an expanded opening.

The second contact part BC may be located in the second contact hole 412. The second contact part BC may be a conductive structure according to one embodiment of the present disclosure. In one embodiment, a pair of second contact parts BC may be respectively located in two second contact holes 412 at the edge portions of the opposite sides of the active region 104 in point-symmetry with respect to a center of the active region 104. Each of the second contact parts BC may be electrically connected to one of a pair of second impurity regions 206b formed at the edge portions of the opposite sides of the active region 104. Thus, two conductive paths passing through the second contact parts BC from the second impurity regions 206b of the active region 104 may be formed.

In one embodiment, the second contact part BC may be a storage node contact part. The second contact part BC may have a stacked structure in which a second contact plug 414, a metal silicide film 415, a barrier film 417, and a landing pad 418 are sequentially stacked from a lower part of the second contact hole 412. In one embodiment, the second contact plug 414 may be referred to as a buried contact.

The second contact plug 414 may be formed by burying the conductive material described above in the lower part of the second contact hole 412. The second contact plug 414 may be a first conductor according to one embodiment of the present disclosure. In the present disclosure, the term "first conductor" may also include the metal silicide film 415 formed on the second contact plug 414. The conductive material may be filled toward a center of the second contact hole 412 from edges of the second contact hole 412. While the second contact hole 412 is filled with the conductive material, a seam may be formed near the center of the second contact plug 414 at which the conductive materials filled from the edges of the second contact hole 412 meet. Thus, a void (not shown) may be formed at a lower part of the second contact plug 414. In one embodiment, the second contact plug 414 may be impurity-doped polysilicon.

The metal silicide film 415 may be formed on the second contact plug 414. The metal silicide film 415 may include, for example, titanium silicide, cobalt silicide, nickel silicide, tungsten silicide, platinum silicide, or molybdenum silicide. The barrier film 417 may be conformally formed on an inner side surface of the second contact hole 412 including the metal silicide film 415 therein. The barrier film 417 may surround a side surface and a lower surface of the landing pad 418, which will be described in detail below, and may not extend on an upper surface of landing pad 418. In one embodiment, the barrier film 417 may include a titanium nitride.

The landing pad 418 may be formed in the second contact hole 412 including the barrier film 417 therein. The landing pad 418 may be a second conductor according to one embodiment of the present disclosure. In the present disclosure, the term "second conductor" may be understood to include the barrier film 417. In one embodiment, the landing pad 418 may be a part electrically connecting the capacitor CAP, which will be described in detail below, to the second contact part BC. The landing pad 418 may include a metal such as tungsten.

The landing pad 418 may include a contact part 418a, a neck part 418b, and a pad part 418c. In one embodiment, the contact part 418a, the neck part 418b, and the pad part 418c of the landing pad 418 may be connected in roughly a horse head shape when viewed from the cross-sectional views taken in a direction perpendicular to the surface of the substrate 100. The contact part 418a may be buried in the second contact hole 412 and extend in a depth direction of the substrate 100. A lower part of the contact part 418a surrounded by the barrier film 417 may be electrically connected to the second contact plug 414 via the metal silicide film 415. The neck part 418b may extend from an upper part of the contact part 418a. A portion of an upper part of the second contact hole 412 may be filled with the neck part 418b. A portion of the neck part 418b in the second direction D2 may be removed by etching. Thus, a width or thickness of the neck part 418b in the second direction D2 may be less than widths or thicknesses of the contact part 418a and the pad part 418c. The pad part 418c may extend from an upper part of the neck part 418b. The pad part 418c may protrude outwards from the second contact hole 412 and be expanded in the second direction D2 and/or the third direction D3. The width or thickness of the pad part 418c in the second direction D2 and/or the third direction D3 may be greater than that of the contact part 418a when viewed from the plan view. A planar area occupied by the pad part 418c may be greater than that occupied by the contact part 418a. In one embodiment, the pad part 418c may be shifted by a predetermined distance from the contact part 418a in the second direction D2. The pad part 418c may be provided on the second contact hole 412 in a zigzag form in the third direction D3 as illustrated in FIG. 1A.

A recess 125 may be formed around the landing pad 418. The recess 125 may be formed to surround the vicinity of the pad part 418c of the landing pad 418. Landing pads 418 adjacent to each other may be separated by the recess 125. The recess 125 may be formed by removing portions of upper parts of the landing pad 418, the barrier film 417, the spacer structure SS, and the hard mask pattern 314. In this case, a portion of the landing pad 418 on the second contact hole 412 may be removed. A second interlayer insulating film 126 may be buried in the recess 125. An etch stop film 129 may be formed on the second interlayer insulating film 126. The second interlayer insulating film 126 and the etch stop film 129 may include the insulating material described above. The pad part 418c of the landing pad 418 may be exposed by patterning the etch stop film 129. The capacitor CAP may be provided on the pad part 418c of the landing pad 418.

The capacitor CAP may include a lower electrode 502, a dielectric layer 504, and an upper electrode 506. In one embodiment, the lower electrode 502 may have roughly a cylindrical shape, the bottom of which is closed and the top of which is open. The lower electrode 502 may include the conductive material described above. The dielectric layer 504 may be conformally formed along inner and outer side surfaces of the lower electrode 502. The dielectric layer 504 may include a high-k dielectric material, a silicon oxide, a silicon oxynitride, a silicon nitride, or a combination thereof. For example, the dielectric layer 504 may include a high-k dielectric layer such as an aluminum oxide, a zirconium oxide, or a hafnium oxide. The upper electrode 506 may be provided on the lower electrode 502 by being buried in the lower electrode 502 on which the dielectric layer 504 is formed. The upper electrode 506 may include the conductive material described above.

The capacitor CAP may be a signal storage unit according to one embodiment of the present disclosure. It will be understood that the term "signal storage unit" is not limited a capacitor and may include various types of signal storage means using the conductive path described above. For example, a magnetic tunnel junction (MTJ), a phase-change pattern, a resistive change pattern, or a combination thereof may be formed on the landing pad 418.

A spacer structure SS according to one embodiment of the present disclosure will be described in detail with reference to FIGS. 2A to 2E below.

Figure 2A:
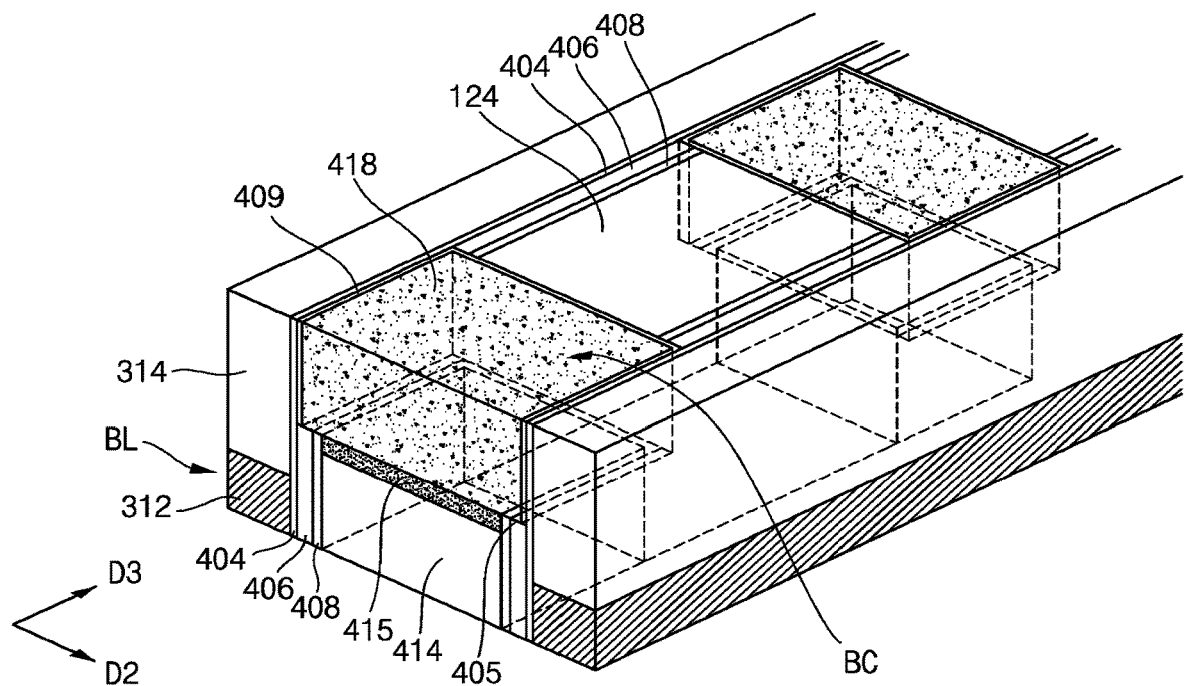
FIGS. 2A and 2B are perspective views of the region E of FIG. 1B.
Figure 2B:
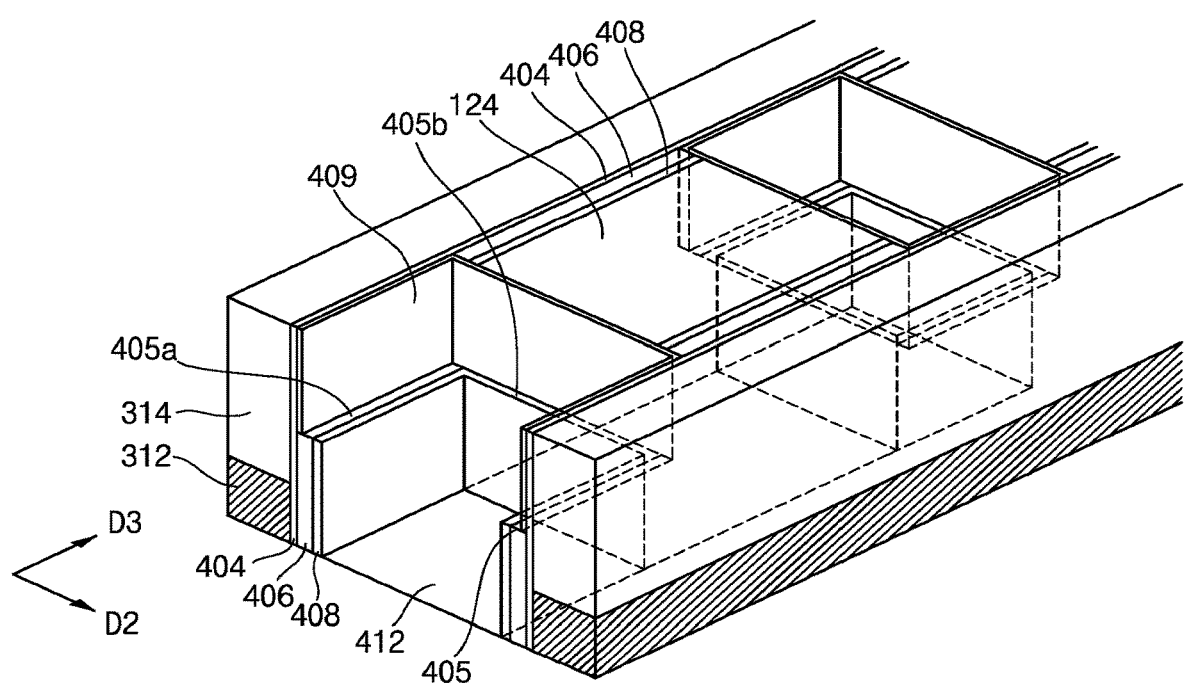
Figure 2C:
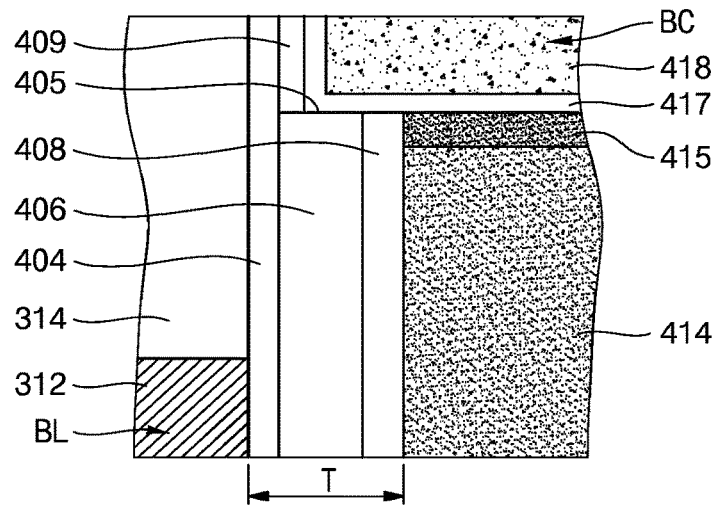
FIGS. 2C, 2D and 2E are cross-sectional views illustrating various expansion parts of a spacer structure according to one embodiment of the present disclosure.
Figure 2D:
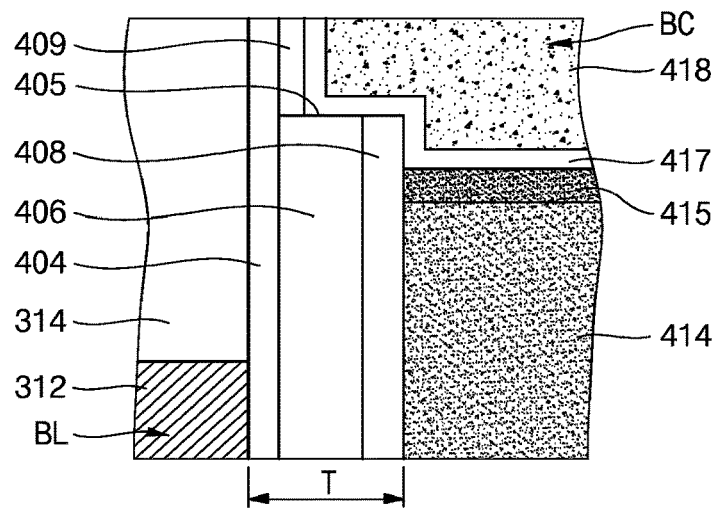
Figure 2E:
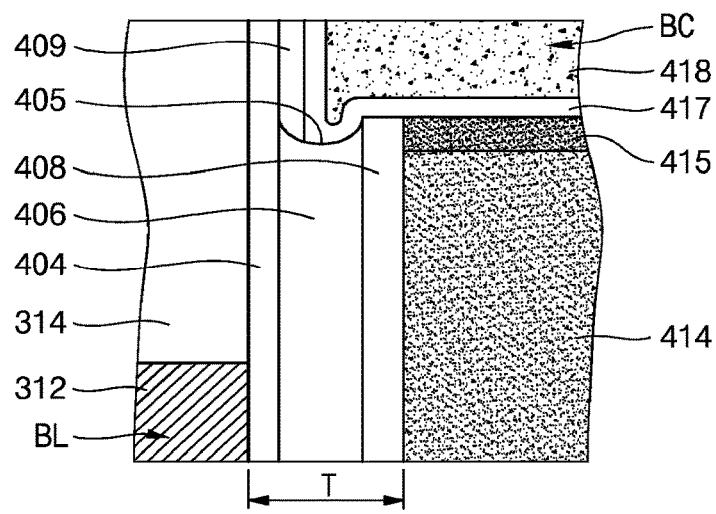

FIGS. 2A to 2E are diagrams schematically illustrating a structure of a spacer structure SS according to one embodiment of the present disclosure. FIG. 2A is a perspective view of the region E of FIG. 1B. FIG. 2B is a perspective view schematically illustrating a structure of the spacer structure SS of FIG. 2A in which a second contact part BC is removed. FIGS. 2C to 2E are cross-sectional views illustrating various structures of the expansion part 405 according to one embodiment of the present disclosure.

Referring to FIGS. 2A and 2B, a semiconductor device 10 according to one embodiment of the present disclosure may include a spacer structure SS. The spacer structure SS may include first, second, and third spacers 404, 406, and 408 between adjacent bit line structures BLS.

The first, second, and third spacers 404, 406, and 408 may be sequentially stacked on one of opposite side surfaces of the bit line structure BLS. The first spacer 404 may extend on the one of the opposite side surfaces of the bit line structure BLS and may extend in the third direction D3. In one embodiment, the first spacer 404 may entirely cover one of side surfaces of the bit line BL and the hard mask pattern 314 or may expose a portion of an upper part of the hard mask pattern 314. The first spacer 404 may be referred to as an inner spacer according to one embodiment of the present disclosure. The second spacer 406 may extend in the third direction D3 and may extend on (e.g., may cover) an outer side surface of the first spacer 404 on the bit line structure BLS. The third spacer 408 may extend in the third direction D3 and may extend on (e.g., may cover) an outer side surface of the second spacer 406 on the first spacer 404. The second spacer 406 and the third spacer 408 may be referred to as respectively an intermediate spacer and an outer spacer according to one embodiment of the present disclosure. In one embodiment, an upper surface of the third spacer 408 may be substantially coplanar with an upper surface of the first spacer 404 and/or an upper surface of the second spacer 406 or may have a height different from a height of the first spacer 404 and/or a height of the second spacer 406. The first to third spacers 404, 406, and 408 may each include the insulating material described above. In one embodiment, the first spacer 404 may be a nitride film. The second spacer 406 may be an oxide film. The third spacer 408 may be a nitride film.

The first spacer 404 may function as an etch stop film when portions of the upper parts of the second and third spacers 406 and 408 are etched. In one embodiment, the first spacer 404 may have an etch selectivity with respect to the second spacer 406 and/or the third spacer 408. The first spacer 404 may be a film having a higher density than those of the second and third spacers 406 and 408. In one embodiment, the first spacer 404 may include a silicon oxynitride film.

The second spacer 406 may sufficiently separate the bit line BL and the second contact part BC from each other, together with the third spacer 408 or independently from the third spacer 408. In one embodiment, the second spacer 406 may have a film thickness which is thicker than that of the first spacer 404 and/or that of the third spacer 408. The third spacer 408 may have a thickness which is thicker than that of the first spacer 404. In one embodiment, the first spacer 404 may have a thickness of about 2 nm, the second spacer 406 may have a thickness of about 6 nm, and the third spacer 408 may have a thickness of about 4 nm.

In one embodiment, an outer side surface of the third spacer 408, which is opposite an inner side surface of the third spacer 408 that faces the second spacer 406, may be exposed to a second contact hole 412. Thus, the third spacer 408 may define a portion of the second contact hole 412 defining a shape of a second contact plug 414 and/or a shape of a contact part 418a of a landing pad 418 buried in the second contact hole 412.

Two inner side surfaces of the second contact hole 412 facing each other in the second direction D2 and between the adjacent bit line structures BLS may be defined by the first to third spacers 404, 406, and 408 formed at the opposite side surfaces of the bit line structures BLS facing each other in the second direction D2. Insulating fences 124 may be located on opposite side surfaces of the second contact hole 412 facing each other in the third direction D3. The insulating fence 124 may connect adjacent bit line structures BLS at predetermined intervals in the third direction D3. Thus, two inner side surfaces of the second contact hole 412 facing each other in the third direction D3 may be defined by opposite side surfaces of the insulating fences 124 facing each other in the third direction D3. The second contact hole 412 may be formed in a certain pattern by a space surrounded by the two inner side surfaces thereof defined by the first to third spacers 404, 406, and 408 in the second direction D2 and the two inner side surfaces thereof defined by the insulating fences 124 in the third direction D3. The second contact plug 414 of the second contact part BC described above and the contact part 418a of the landing pad 418 may be buried in the second contact hole 412.

As an integration degree of a semiconductor device is increasing, a device size is decreasing. Thus, a reliability problem such as a conduction defect or performance degradation may occur due to even slight misalignment or dispersion during a conductive pattern deposition process or an etching process. To reduce such problems, increasing a size of the conductive pattern may be beneficial to provide a sufficient process margin. A sufficient space in which the conductive pattern is formed may be secured to increase the size of the conductive pattern. In the present disclosure, this space may be secured by an expansion part 405, which will be described below.

Still referring to FIGS. 2A and 2B, the second contact plug 414 may be buried in the second contact hole 412. The second contact plug 414 may be formed to have a predetermined height in the second contact hole 412 by forming (e.g., depositing) the conductive material described above on entire surface of the substrate 100 and performing planarization and/or etch-back processes thereon. A portion of the upper part of the second spacer 406 and/or the upper part of the third spacer 408 forming the inner side surfaces of the second contact hole 412 facing each other in the second direction D2 may be removed by etching in a state in which the second contact plug 414 is formed. In one embodiments, upper portions of the second spacer 406 and the third spacer 408 may be removed, as illustrated in FIG. 2B, and thus an expansion part 405 may be formed on a lower part of the second contact hole 412. In one embodiments, the expansion part 405 may have a width in the second direction D2 greater than a width of the lower part of the second contact hole 412 in the second direction D2, and the expansion part 405 may have a width in the third direction D3 greater than a width of the lower part of the second contact hole 412 in the third direction D3, as illustrated in FIG. 2B. Thus, the landing pad 418 buried in the upper part of the second contact hole 412 that includes the expansion part 405 may have a width in a horizontal direction (e.g., the second direction D2 or the third direction D3) greater than a width of the second contact plug 414 in the horizontal direction. Thus, a sufficient process margin may be secured for subsequent processes.

As the portion of the upper part of the second spacer 406 and/or the portion of the upper part of the third spacer 406 is removed by the etching process, a height of the upper part of the second spacer 406 and/or a height of the upper part of the third spacer 408 may be decreased to be less than that of the second contact hole 412. Thus, at least a portion of an etched surface of the second spacer 406 and/or an etched surface of the third spacer 408 may be exposed to the second contact hole 412 and may thus protrude into the second contact hole 412.

The fourth spacer 409 may be formed on the upper surface of the second spacer 406 and/or the upper surface of the third spacer 408 protruding into the second contact hole 412. In one embodiment, a lower surface of the fourth spacer 409 may be located on the upper surface of the second spacer 406. A portion of the fourth spacer 409 may be located on upper inner side surfaces of the second contact hole 412 in the second direction D2, in which the second spacer 406 and/or the third spacer 408 is removed. The portion of the fourth spacer 409 may extend on (e.g., may cover) an upper outer side surface of the first spacer 404. Thus, a multi-layered film structure including the first and fourth spacers 404 and 409 may be provided on the inner upper side surfaces of the second contact hole 412 in the second direction D2. The contact part 418a of the landing pad 418 may be buried between the upper inner side surfaces of the second contact hole 412 covered with the fourth spacer 409. Thus, the contact part 418a of the landing pad 418 may be insulated from the bit line BL by the first spacer 404, the fourth spacer 409, and the hard mask pattern 314.

In the etching process described above, portions of upper inner side surfaces of the insulating fences 124 at the opposite side surfaces of the second contact hole 412 in the third direction D3 may be also removed. The portion of the fourth spacer 409 may cover the remaining upper inner side surfaces of the insulating fences 124 which are left after the etching process. Thus, the upper inner side surfaces of the second contact hole 412 may be entirely covered with the fourth spacer 409. In one embodiment, the fourth spacer 409 may be referred to as a capping layer or a capping spacer.

A three-layer structure including the first to third spacers 404, 406, and 408 may be provided at a lower side of the first spacer 404 adjacent to the bit line BL. Accordingly, a distance between the bit line BL and the second contact plug 414 may be increased by the sum of the thicknesses of the first to third spacers 404, 406, and 408 and thus the reliability of insulation between the bit line BL and the second contact plug 414 may be secured. It will be understood that the sum of the thicknesses of the first to third spacers 404, 406, and 408 is "T" in FIGS. 2C, 2D and 2E.

The fourth spacer 409 may include the insulating material described above. In one embodiment, the fourth spacer 409 may be a nitride film. The fourth spacer 409 is formed after the etching process described above is completed and thus may be a film having lower density than the density of the first spacer 404 and/or the density of the third spacer 408 which is exposed in the second contact hole 412 and which is influenced by the etching process. A thickness of the fourth spacer 409 may be substantially the same as or less than that of the first spacer 404. In one embodiment, the fourth spacer 409 may have a film thickness of about 4 nm or less.

As the upper part of the second spacer 406 and/or the upper part of the third spacer 408 is etched and removed, the upper inner side surfaces of the second contact hole 412 formed by outer side surfaces of the fourth spacer 409 may be recessed toward the first spacer 404. The lower inner side surfaces of the second contact hole 412 formed by the remaining outer side surfaces of the second spacer 406 and/or the third spacer 408, which are left after the etching process, may protrude into the second contact hole 412. Thus, a step 405a may be formed near a boundary between the second spacer 406 and/or the third spacer 408 and the fourth spacer 409, when viewed from the cross-sectional views in the direction perpendicular to the surface of the substrate 100.

That is, the step 405a may be formed between an outer side surface of the third spacer 408 exposed at the lower part of the second contact hole 412 and an outer side surface of the fourth spacer 409 exposed at the upper part of the second contact hole 412, such that the upper part of the second contact hole 412 is more recessed toward the fourth spacer 409 than the lower part thereof. The step 405a may be recessed by the difference between an etched thickness of the second spacer 406 and/or an etched thickness of the third spacer 408 and the thickness of the fourth spacer 409 at the etched surface(s) as a boundary where the upper surface of the second spacer 406 and/or the upper surface of the third spacer 408 and a lower surface of the fourth spacer 409 are in contact. The width of the upper part of the second contact hole 412 in the second direction D2 may be increased more than that of the lower part thereof at the boundary formed by the step 405a as illustrated in FIG. 2B.

The step 405a may be provided on the etched surface of the second spacer 406 and/or the etched surface of the third spacer 408 which is left after the etching process. When the conductive material is buried in the second contact hole 412 to form the landing pad 418, an edge part of an end of or a lowermost end of a side surface of the contact part 418a may be provided on the upper surface of the second spacer 406 and/or the upper surface of the third spacer 408 on which the step 405a is formed. Thus, a width or thickness of the contact part 418a of the landing pad 418 near the boundary at which the step 405a is formed may outwardly protrude and be increased by the size of the step 405a.

During the etching process described above, a portion of the upper part of the insulating fence 124 may be also removed. As the portion of the upper part of the insulating fence 124 is etched and removed, the upper inner side surfaces of the second contact hole 412 facing each other in the third direction D3 may be more recessed toward the insulating fences 124 than the lower inner side surfaces thereof and thus a step 405b may be formed between the upper and lower inner side surfaces of the second contact hole 412. Thus, a width or thickness of the contact part 418a of the landing pad 418 at which the step 405b is formed may outwardly protrude and be increased by the size of the step 405b. In one embodiment, a width of the upper part of the second contact hole 412 in the second direction D2 may be greater than a width of the upper part of the second contact hole 412 in the third direction D3 as illustrated in FIG. 2B.

The second spacer 406 and/or the third spacer 408 and the insulating fence 124 may have an etch selectivity with respect to each other. The inner side surfaces of the second contact hole 412 in the third direction D3, at which the insulating fences 124 are located, do not have a three-layer structure including the first to third spacers 404, 406, and 408. Thus, an etch rate of the second contact hole 412 through the above-described etching process in the third direction D3 may be different from that of the second contact hole 412 through the above-described etching process in the second direction D2. Thus, the size (e.g., a width in the third direction D3) of the step 405b formed on the insulating fence 124 may be different from a size (e.g., a width in the second direction D2) of the step 405a formed on the second spacer 406 and/or the third spacer 408.

In one embodiment, the step 405a formed by the second and third spacers 406 and 408 may be greater than the step 405b formed by the insulating fence 124. In one embodiment, a width of the step 405a formed by the second and third spacers 406 and 408 in the second direction D2 may be greater than a width of the step 405b formed by the insulating fence 124 in the third direction D3, as illustrated in FIG. 2B. Accordingly, the width or thickness of the contact part 418a of the landing pad 418 buried in the upper part of the second contact hole 412 may protrude and be increased to a greater degree in the second direction D2 than in the third direction D3. In one embodiment, a width of the contact part 418a, in the second direction D2, of the landing pad 418 buried in the upper part of the second contact hole 412 may be greater than a width of the contact part 418a, in the third direction D3, of the landing pad 418 buried in the upper part of the second contact hole 412 as illustrated in FIG. 2B.

The steps 405a and 405b of the second contact hole 412 described above may define the expansion part 405. It will be understood that the term "expansion part" may refer to a structure having a discontinuously increased width from adjacent portions. The expansion part 405 may have various structures as illustrated in FIGS. 2C to 2E. It should be understood that structures of the expansion part 405 may not be limited to those illustrated in FIGS. 2C to 2F and may have different structures. Although not described in detail, embodiments which will be described below and various combinations thereof should be understood to be included in one embodiment of the present disclosure.

Referring to FIG. 2C, the expansion part 405 on the second spacer 406 and/or the third spacer 408 adjacent to the bit line BL may be disposed at a higher level than a metal-containing layer 312 of the bit line BL. In one embodiment, the upper surface of the second spacer 406 may be at a higher level than the metal-containing layer 312 of the bit line BL. Thus, the bit line BL and the second contact part BC may be sufficiently separated from each other in a thickness-wise direction (e.g., a vertical direction) of the first to third spacers 404, 406, and 408, and the landing pad 418 located on the upper surface of the second spacer 406 and the bit line BL may be also sufficiently separated from each other in a height-wise direction (e.g., a vertical direction) of the second spacer 406 and/or the third spacer 408, thereby securing the reliability of insulation between the bit line BL and the second contact part BC.

In one embodiment, the upper surface of the second spacer 406 and/or the upper surface of the third spacer 408, which define the expansion part 405, may be substantially flat. In one embodiment, the upper surface of the second spacer 406 and the upper surface of the third spacer 408, which define the expansion part 405, may be substantially flat as illustrated in FIGS. 2C and 2D. If the upper surface of the second spacer 406 and/or the upper surface of the third spacer 408 includes irregularities, it may be determined that the upper surface of the second spacer 406 and/or the upper surface of the third spacer 408 is substantially flat when the irregularities have a size of about 5 nm or less. The expansion part 405 may have a straight-line structure, a curved structure, or another structure tilted in various shapes in the height-wise direction or the thickness-wise direction of the second spacer 406 and/or the third spacer 408. In one embodiment, the upper surface of the second spacer 406 may protrude more upwardly than that of the third spacer 408.

In one embodiment, the upper surface of the second spacer 406 and/or the upper surface of the third spacer 408, which define the expansion part 405, may be substantially coplanar with an upper surface of the second contact plug 414 buried in the lower part of the second contact hole 412. In one embodiment, the upper surface of the second spacer 406 and the upper surface of the third spacer 408, which define the expansion part 405, may be substantially coplanar with an upper surface of the first conductor that includes the second contact plug 414 and the metal silicide film 415, as illustrated in FIGS. 2D and 2E.

In one embodiment, the upper surface of the second spacer 406 and the upper surface of the third spacer 408, which define the expansion part 405, may be at a higher level than the upper surface of the second contact plug 414 as illustrated in FIG. 2D. In one embodiment, the distance between the upper surface of the second contact plug 414 and the upper surface of the second spacer 406 may be greater than the sum of the thicknesses of the first to third spacers 404, 406, and 408. Thus, an edge part of the end of the landing pad 418 overlapping the upper surface of the second spacer 406 and the upper surface of the third spacer 408, which define the expansion part 405, may be located at a higher level thereby reducing or possibly preventing diffusion of a metal element contained in the landing pad 418 into the metal-containing layer 312 of the bit line BL via the etched surfaces (i.e., the upper surface of the second spacer 406 and the upper surface of the third spacer 408) defining the expansion part 405.

In one embodiment, the expansion part 405 may extend into the second spacer 406 and/or the third spacer 408. In one embodiment, the expansion part 405 may extend into the second spacer 406, and thus the upper surface of the second spacer 406 may include a concave part as illustrated in FIG. 2E. In one embodiment, the expansion part 405 may extend into the second spacer 406 and the third spacer 408, and thus the upper surfaces of the second spacer 406 and the third spacer 408 may include a concave part. A lowermost end of the concave part may be located on the upper surface of the second spacer 406, and an uppermost end of the concave part may be located on the upper surface of the third spacer 408. It will be understood that the concave part of the upper surface of the second spacer 406 can be referred to as a recessed portion.

A vertical distance between the uppermost end and the lowermost end of the concave part (i.e., a depth of the concave part) may be less than the sum of the thicknesses of the first to third spacers 404, 406, and 408. Thus, even if the expansion part 405 may extend into includes the second spacer 406 and/or the third spacer 408, the bit line BL and the second contact part BC may be sufficiently separated from each other by the first to third spacers 404, 406, and 408 adjacent to the expansion part 405, thereby securing the reliability of insulation. In one embodiment, the lowermost end of the concave part may be at a lower level than the metal silicide film 415, as illustrated in FIG. 2E. In one embodiment, the lowermost end of the concave part may be at a lower level than an upper end of the second contact plug 414. In one embodiment, the depth of the concave part may be about 10 nm or less.

In one embodiment, a portion of the fourth spacer 409 may be in the concave part, as illustrated in FIGS. 2C, 2D and 2E. In one embodiment, a portion of the barrier film 417 may be in the concave part, as illustrated in FIGS. 2C, 2D and 2E. In one embodiment, the fourth spacer 409 may be formed to cover the entire concave part. The portion of the fourth spacer 409 covering the concave part may function as a diffusion-barrier wall that may reduce or possibly prevent diffusion of the metal element contained in the landing pad 418 into the metal-containing layer 312 of the bit line BL.

In one embodiment, the concave part may be filled with the barrier film 417 and/or the landing pad 418. In one embodiment, a lowermost end of the barrier film 417 and/or a lowermost end of the landing pad 418 may be at a lower level than the metal silicide film 415 (e.g., an upper surface of the metal silicide film 415), as illustrated in FIG. 2E. In one embodiment, the lowermost end of the barrier film 417 and/or the lowermost end of the landing pad 418 may be at a lower level than the upper end of the second contact plug 414. In one embodiment, a distance (e.g., vertical distance) between the lowermost end of the barrier film 417 and/or the lowermost end of the landing pad 418 and the upper end of the second contact plug 414 may be about 10 nm or less. In one embodiment, as illustrated in FIG. 2E, the lowermost end of the barrier film 417 and the lowermost end of the landing pad 418 may be at a lower level than the upper end of the metal silicide film 415, and a distance (e.g., vertical distance) between the lowermost end of the barrier film 417 and the upper end of the metal silicide film 415 may be may be about 10 nm or less. Stated differently, a level of the lowermost end of the barrier film 417 is higher than a level of the upper end of the metal silicide film 415 by about 10 nm or less.

A method of manufacturing a semiconductor device according to one embodiment of the present disclosure will be described in detail with reference to FIGS. 3A through 10C below.

Figure 3A:
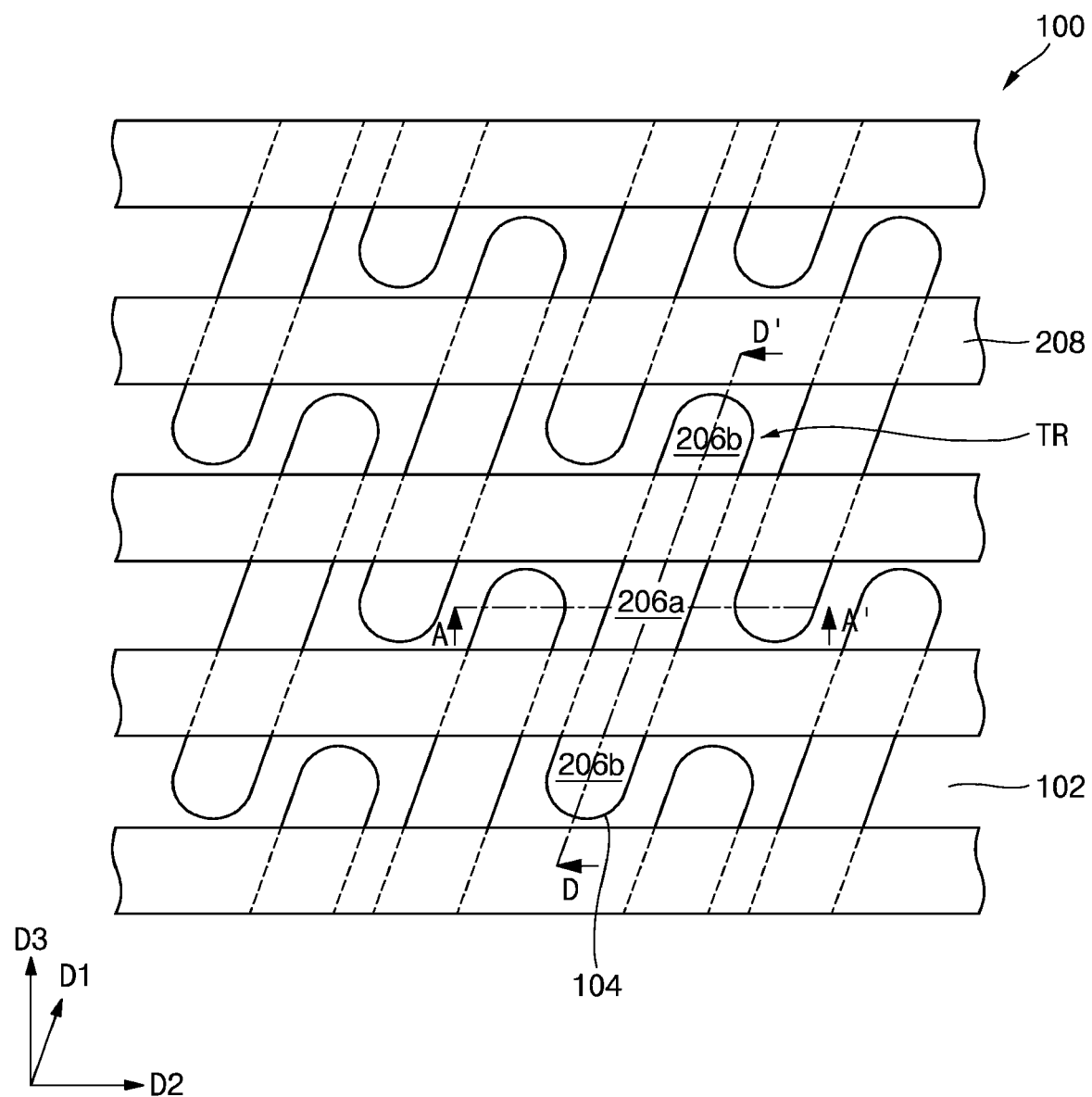
FIGS. 3A, 4A, 5A, 6A, 7A, 8A, 9A and 10A are plan views schematically illustrating a process of manufacturing a semiconductor device according to one embodiment of the present disclosure.

FIGS. 3A, 4A, 5A, 6A, 7A, 8A, 9A and 10A are plan views schematically illustrating a process of manufacturing a semiconductor device according to one embodiment of the present disclosure. FIGS. 3B, 4B, 5B, 6B, 7B, 8B, 9B and 10B are cross-sectional views taken along the line A-A' of FIG. 3A are cross-sectional views taken along the line A-A' of FIG. 3A, and FIGS. 3C, 4C, 5C, 6C, 7C, 8C, 9C and 10C are cross-sectional views taken along the line D-D' of FIG. 3A.

Figure 3B:
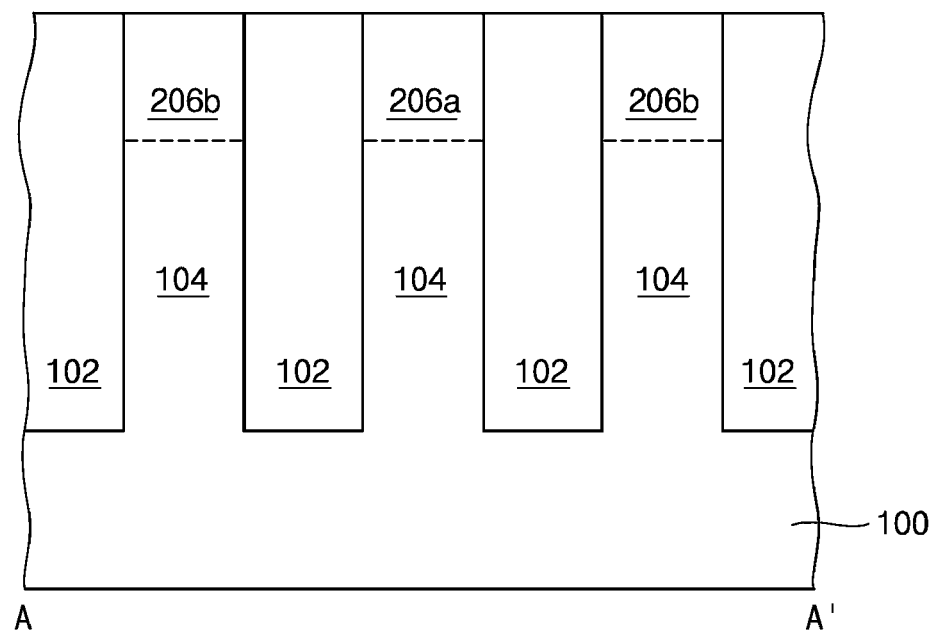
FIGS. 3B, 4B, 5B, 6B, 7B, 8B, 9B and 10B are cross-sectional views taken along the line A-A' of FIG. 3A, and FIGS. 3C, 4C, 5C, 6C, 7C, 8C, 9C and 10C are cross-sectional views taken along the line D-D' of FIG. 3A.
Figure 3C:
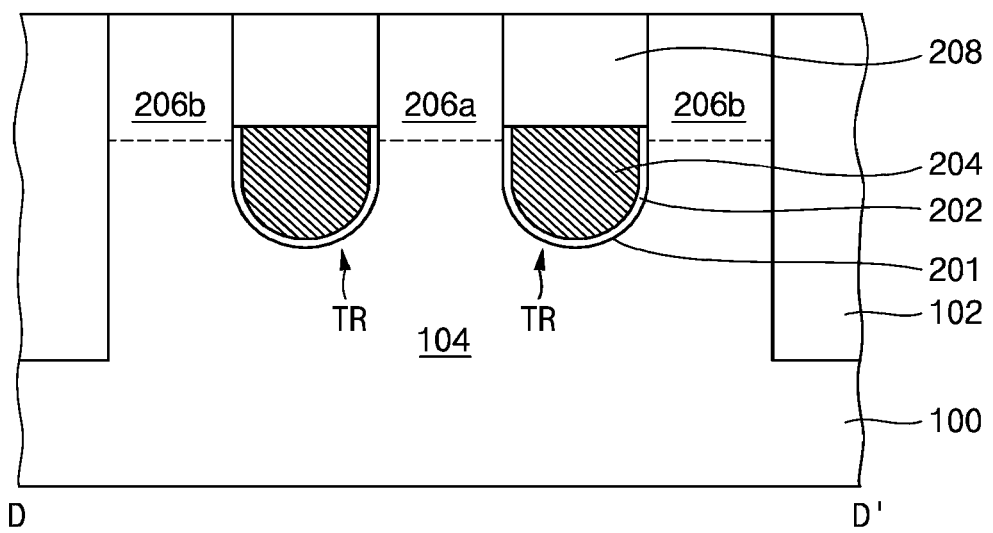

Referring to FIGS. 3A to 3C, a substrate 100 may be patterned to form an isolation region 102 and an active region 104. The isolation region 102 may be formed by etching the substrate 100 in a certain pattern to form an isolation trench and filling the inside of the isolation trench with an insulating material. The active region 104 may be a non-etched region of the substrate 100. The active region 104 may be formed in various shapes and arrangements. An upper portion of the active region 104 may be doped with impurities using, for example, an ion implantation process. Recessed regions 201 may be formed by patterning the substrate 100 including the active region 104 into a pattern having a certain width. The recessed regions 201 may be formed in a pattern passing through opposite edges of the active region 104. An upper part of the active region 104 may be divided by the recessed regions 201 into a first impurity region 206a and a pair of second impurity regions 206b. A gate insulating film 202 may be formed in each of the recessed regions 201. The gate insulating film 202 may be conformally formed on an inner side surface of the recessed region 201 using, for example, a thermal oxidation process or a deposition process. The gate insulating film 202 may include an insulating material, for example, a high-k dielectric material such as a metal oxide. A gate electrode 204 may be formed on the gate insulating film 202. The gate electrode 204 may be formed by filling a conductive material into the recessed region 201 and etching the conductive material thereby leaving a portion of the conductive material in the recessed region 201. A gate capping film 208 may be formed on the gate electrode 204. The gate capping film 208 may be formed by depositing an insulation film on the substrate 100 and etching the gate capping film 208 thereby forming a line pattern having a certain width.

Figure 4A:
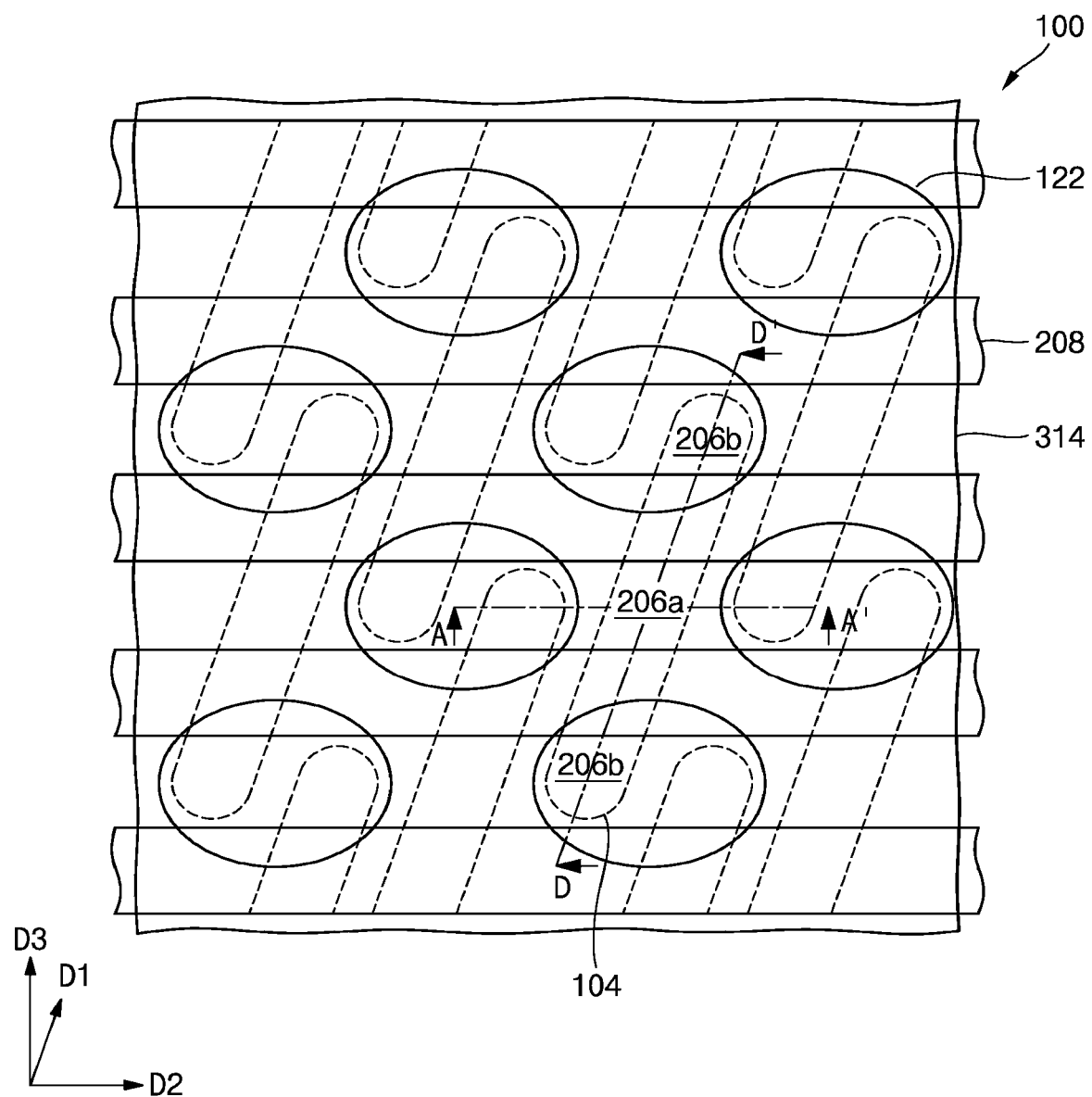
Figure 4B:
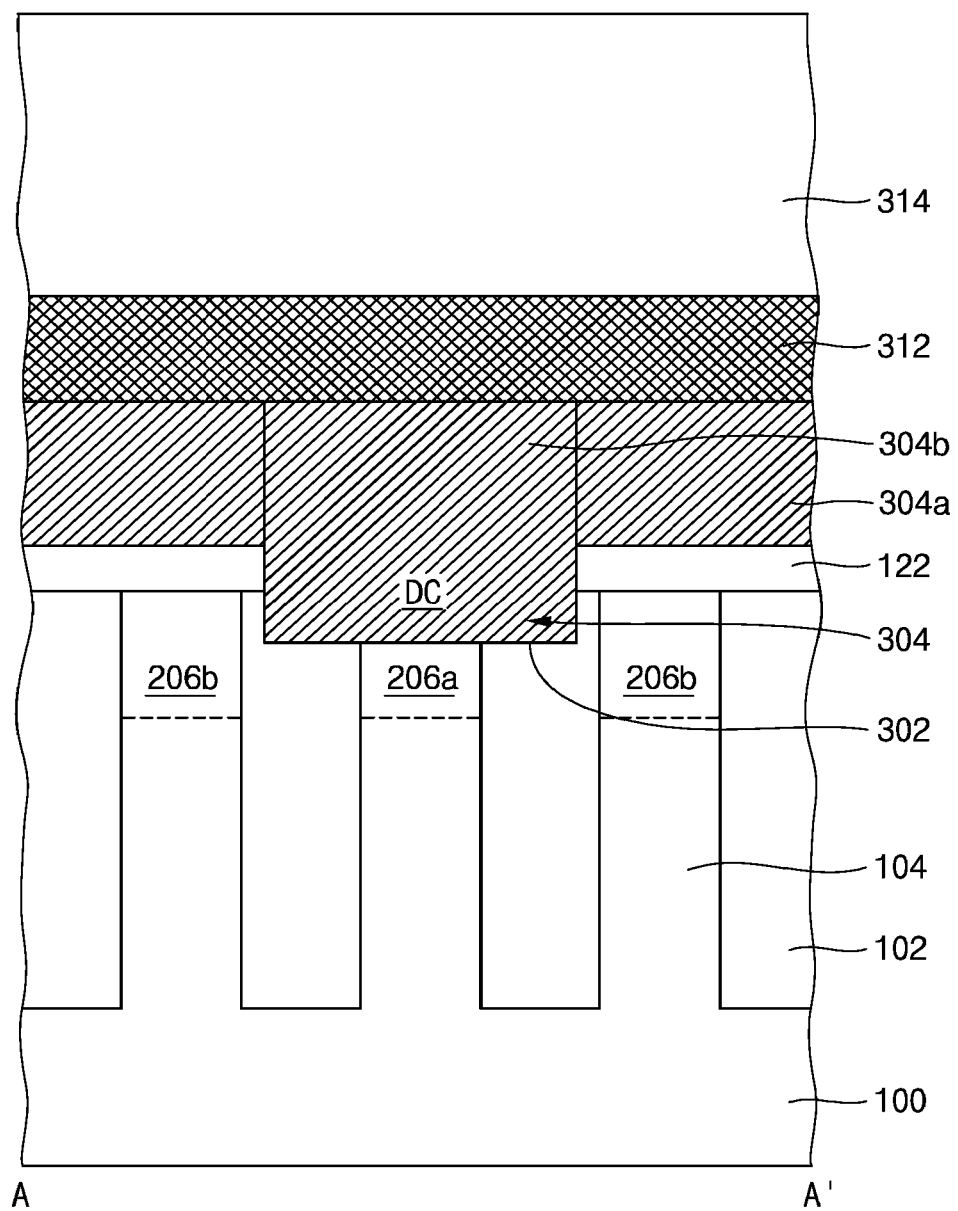
Figure 4C:
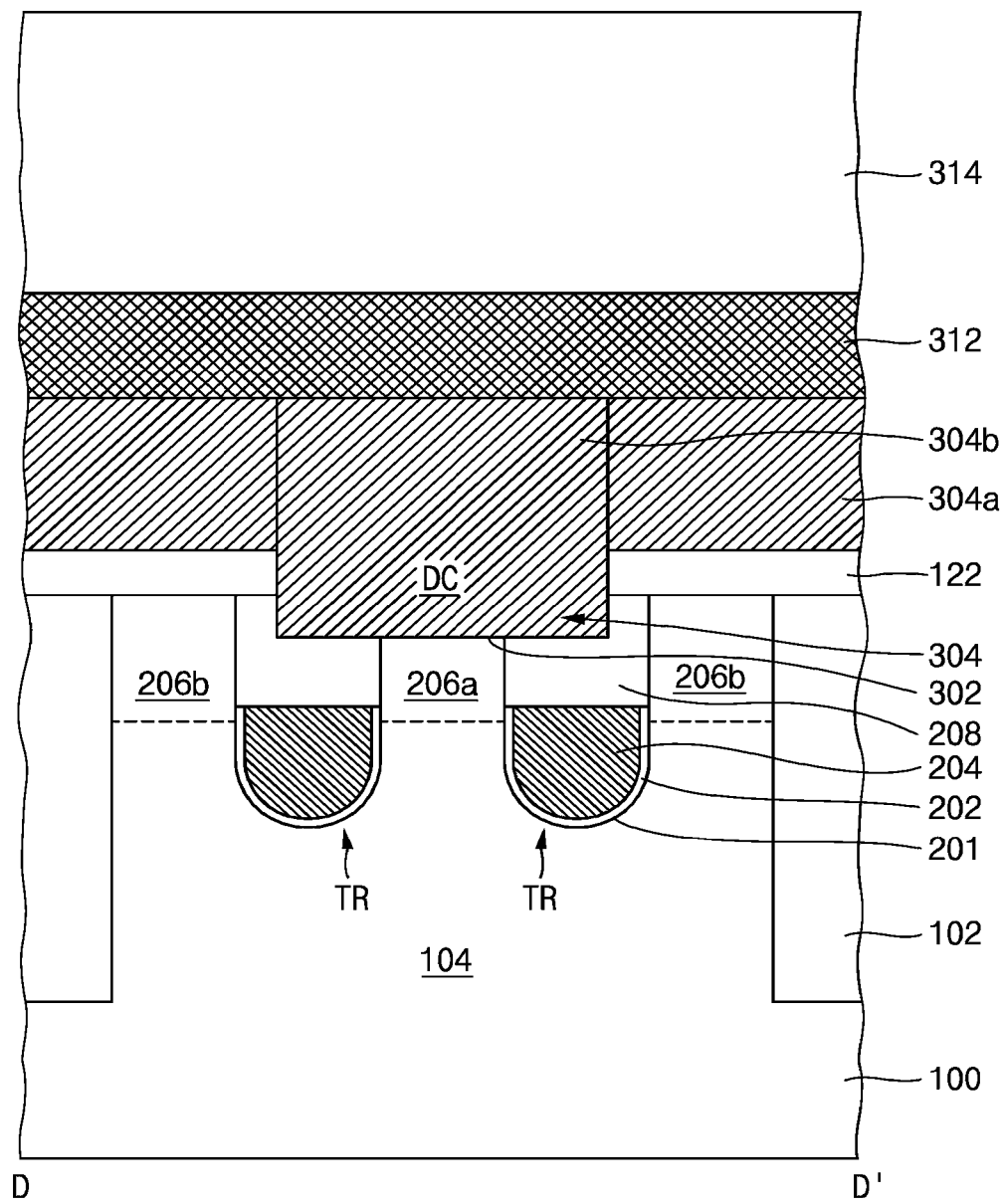

Referring to FIGS. 4A to 4C, a first interlayer insulating film 122 and a first polysilicon pattern 304a may be formed by sequentially forming an insulation film and a polysilicon film on the substrate 100 including the gate capping film 208 formed thereon and patterning the insulation film and the polysilicon film. A first contact hole 302 exposing the first impurity region 206a may be formed in a certain pattern by etching a resultant structure excluding the first interlayer insulating film 122 and the first polysilicon pattern 304a. In one embodiment, the first contact hole 302 may have a flat mesh pattern. When the first interlayer insulating film 122 and the first polysilicon pattern 304a are etched, upper surfaces of the first impurity region 206a, the isolation region 102, and the gate capping film 208 may be over-etched and thus a bottom surface of the first contact hole 302 may be at a lower level than an upper surface of the substrate 100. A second polysilicon pattern 304b may be formed in the first contact hole 302. The second polysilicon pattern 304b may be formed by depositing a polysilicon film on the entire surface of the substrate 100 having the first contact hole 302 therein and planarizing the polysilicon film until an upper surface of the first polysilicon pattern 304a is exposed. A lower surface of the second polysilicon pattern 304b may be located at the bottom surface of the first contact hole 302 which is at a lower level of the upper surface of the substrate 100 and thus may be in contact with an upper surface of the first impurity region 206a of the active region 104. A metal-containing layer 312 and a hard mask pattern 314 may be sequentially formed on the entire surface of the substrate 100 on which the first and second polysilicon patterns 304a and 304b are formed.

Figure 5A:
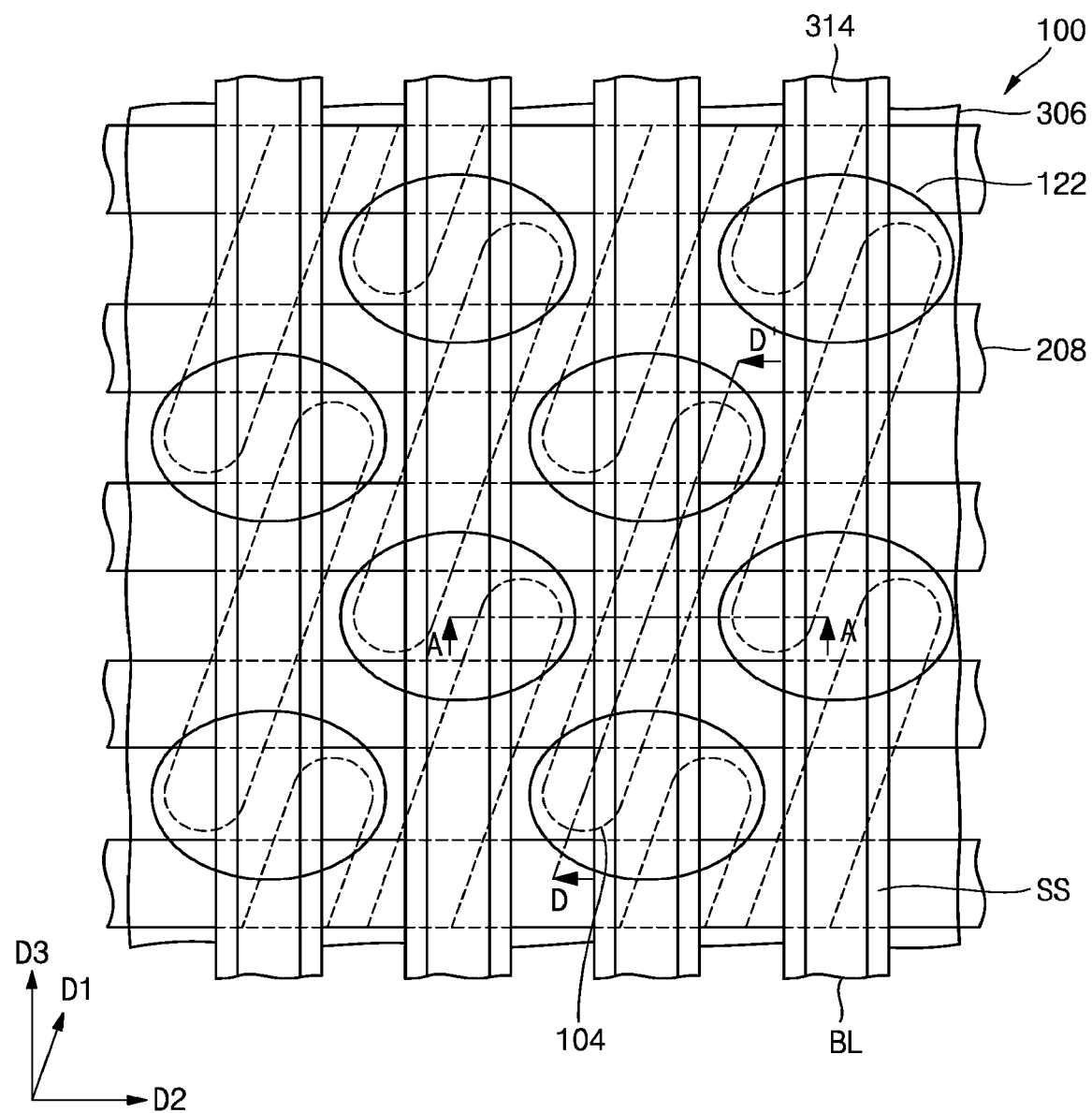
Figure 5B:
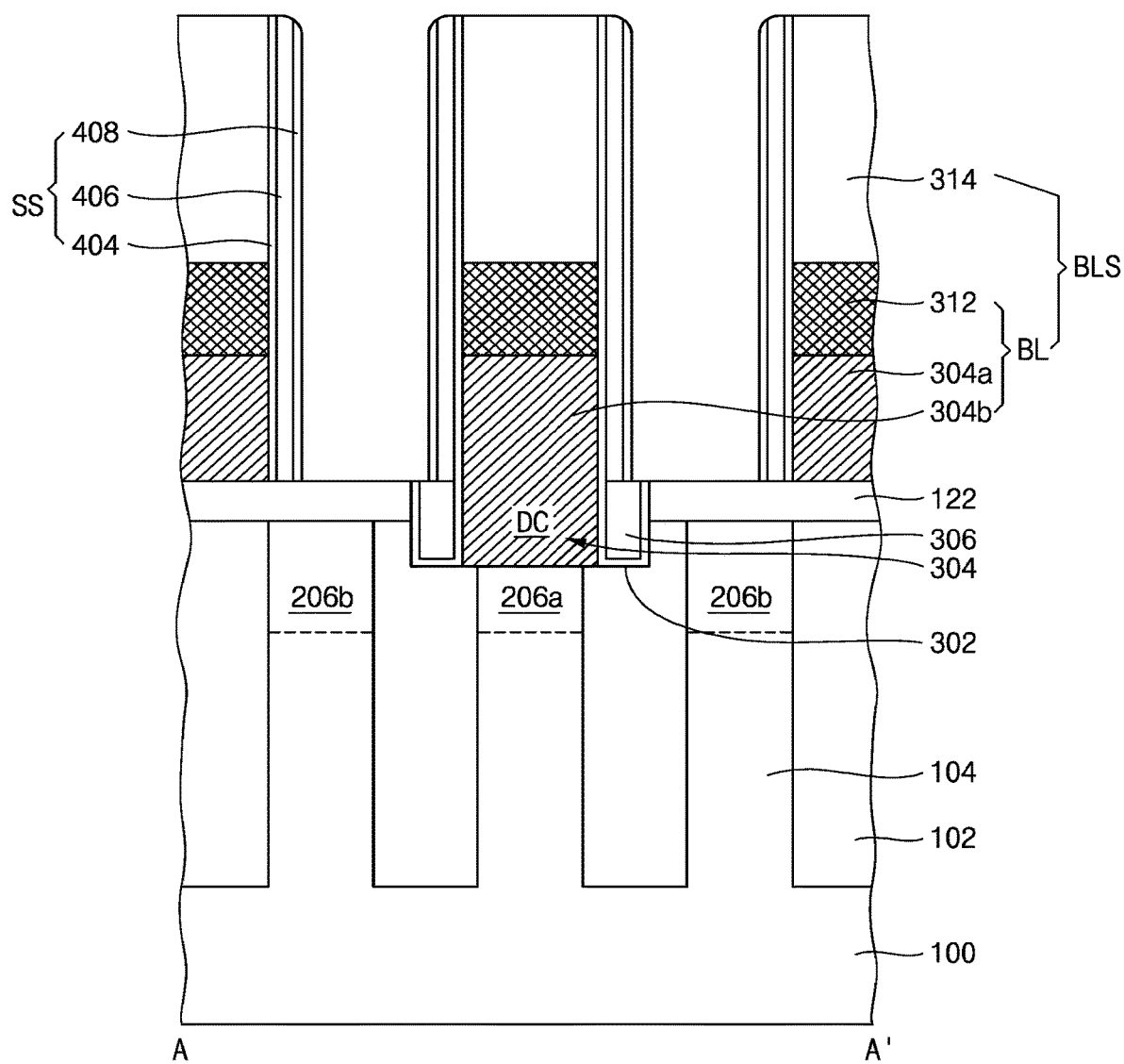
Figure 5C:
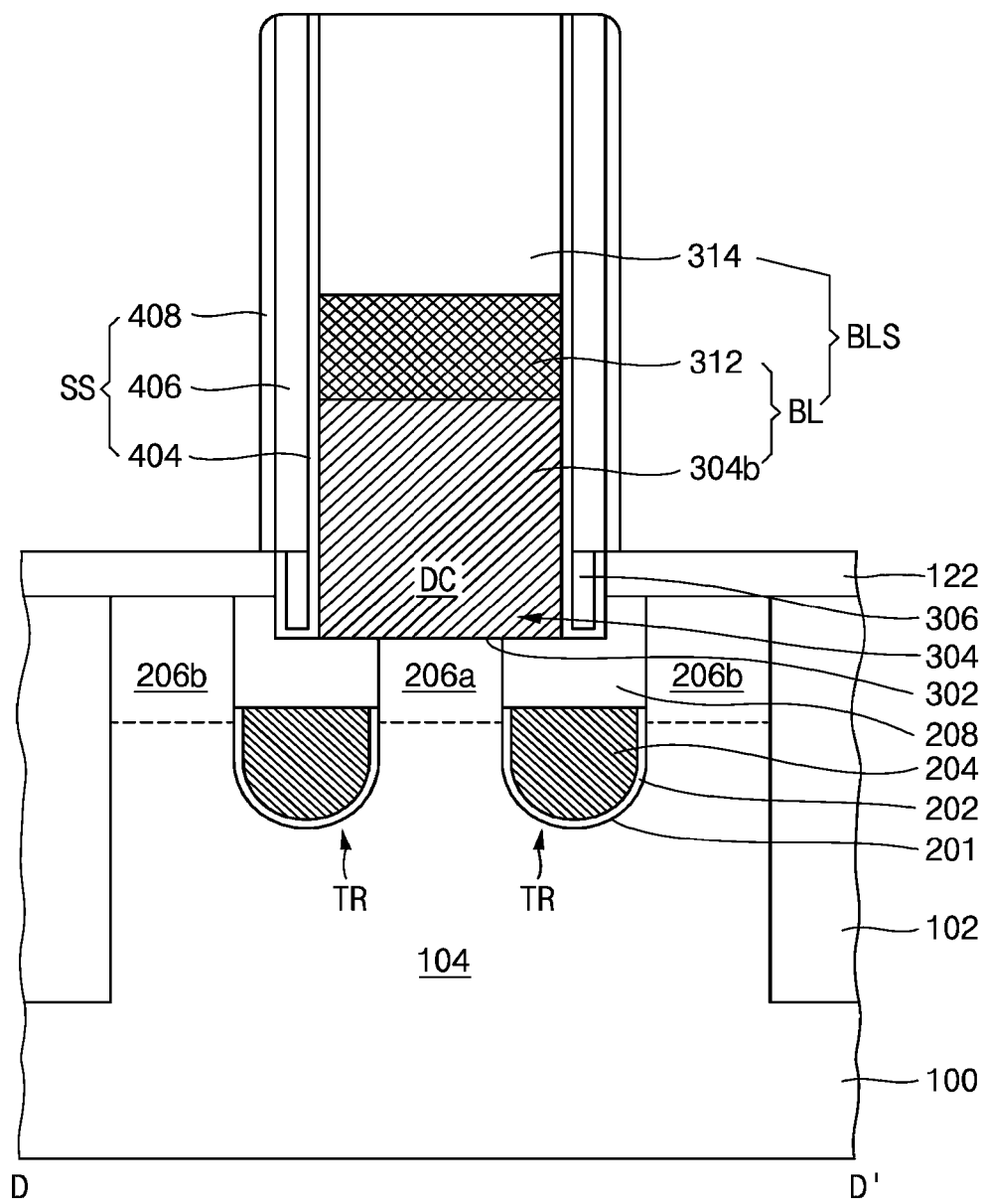

Referring to FIGS. 5A to 5C, a bit line structure BLS including a bit line BL and the hard mask pattern 314 may be formed by etching the layers stacked on the substrate 100 into line patterns which are parallel to a third direction D3. The bit line BL may have a stacked structure including the polysilicon layers 304a and 304b below the metal-containing layer 312. The first and second polysilicon layers 304a and 304b may form continuous line patterns in the third direction D3 as they are connected at opposite boundaries between the first interlayer insulating film 122 and the first contact hole 302 in the third direction D3. A contact plug 304 may be integrally formed with a lower part of the second polysilicon pattern 304b to form a direct contact DC which is in contact with the first impurity region 206a of the active region 104. Portions of inner side surfaces and the bottom surface of the first contact hole 302 may be exposed in a region of the resultant structure excluding the bit line structure BLS as the layers stacked on the substrate 100 are etched. An insulating spacer 306 may be formed in the first contact hole 302 by stacking (e.g., forming) an insulation film on the entire surface of the substrate 100 to fill an exposed portion of the first contact hole 302 and etching the resultant structure until an upper surface of the first interlayer insulating film 122 is exposed. Thus, an upper surface of the insulating spacer 306 may be substantially coplanar with that of the first interlayer insulating film 122.

A first spacer 404 and the insulating spacer 306 may be formed by conformally stacking a first spacer film on the entire surface of the substrate 100 having the bit line structure BL thereon, stacking an insulation film on the first spacer film to fill the first contact hole 302, and anisotropically etching both the first spacer film and the insulation film until the first interlayer insulating film 122 is exposed. Side surfaces and a lower surface of the insulating spacer 306 may be covered with the first spacer film covering inner side surfaces and a lower surface of the first contact hole 302. A second spacer 406 covering outer sides of the first spacer 404 may be formed by conformally stacking a second spacer film on the entire surface of the substrate 100 having the first spacer 404 thereon and performing an anisotropic etching process thereon. A third spacer 408 covering outer sides of the second spacer 406 may be formed by conformally stacking a third spacer film on the entire surface of the substrate 100 having the second spacer 406 thereon and performing the anisotropic etching process thereon.

The first interlayer insulating film 122 may be exposed between a pair of adjacent bit line structures BLS through the anisotropic etching process. The second impurity regions 206b may be exposed by etching the exposed first interlayer insulating film 122. Thus, portions of opposite ends of the first interlayer insulating film 122 in a second direction D2 may be removed (See FIG. 7A). In one embodiment, the first to third spacer films 404, 406, and 408 may be formed by sequentially and conformally stacking spacer films on the entire surface of the substrate 100 on which the insulating spacer 306 is formed and simultaneously etching the spacer films. The first to third spacer films 404, 406, and 408 may entirely cover an upper surface and side surfaces of the bit line structure BLS or partially expose the upper surface and side surfaces of the bit line structure BLS. In one embodiment, the first and third spacer films 404 and 408 may be silicon nitride films, and the second spacer film 406 may be a silicon oxide film. In one embodiment, the first spacer film 404 may be a silicon oxynitride film.

Figure 6A:
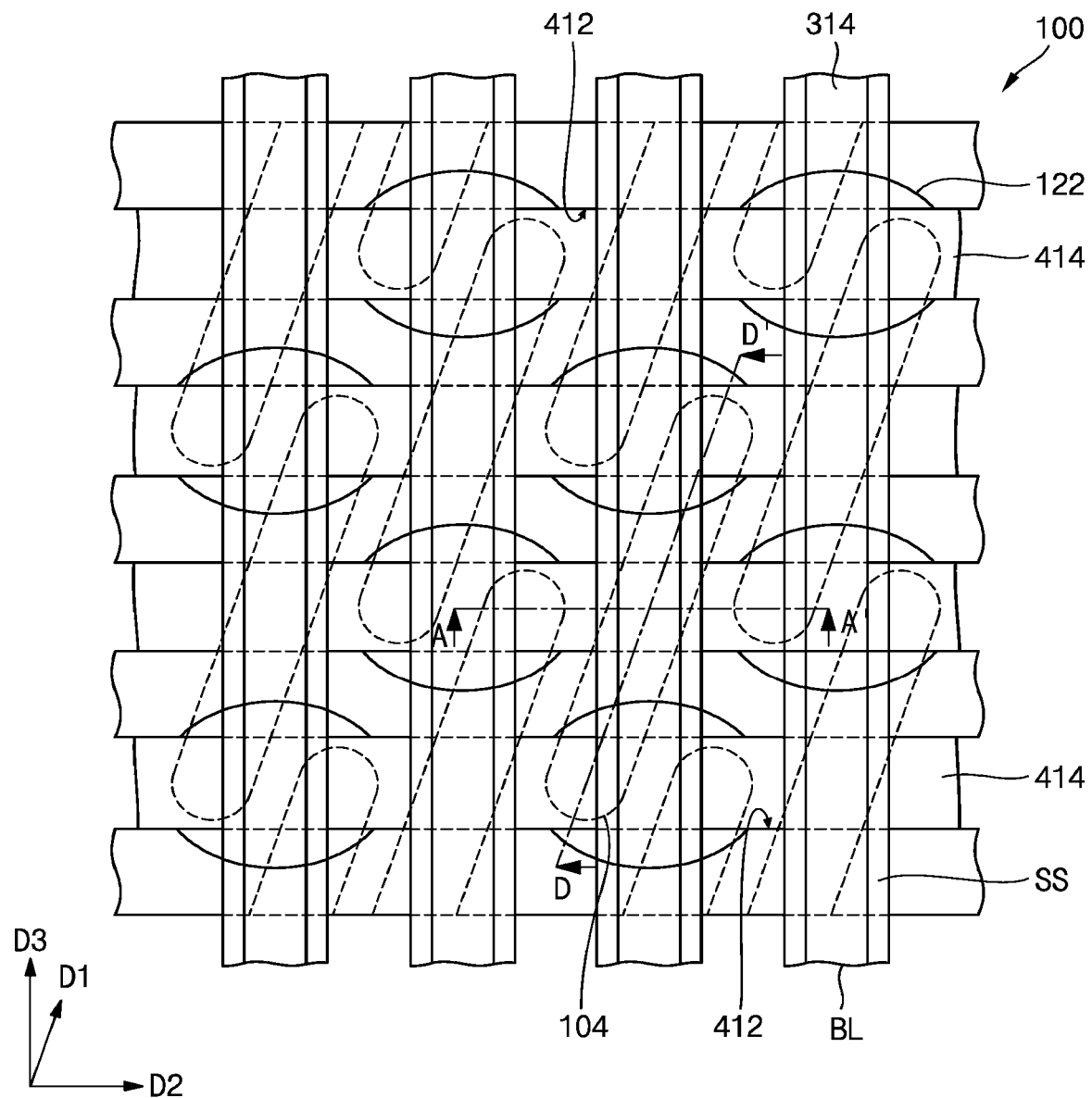
Figure 6B:
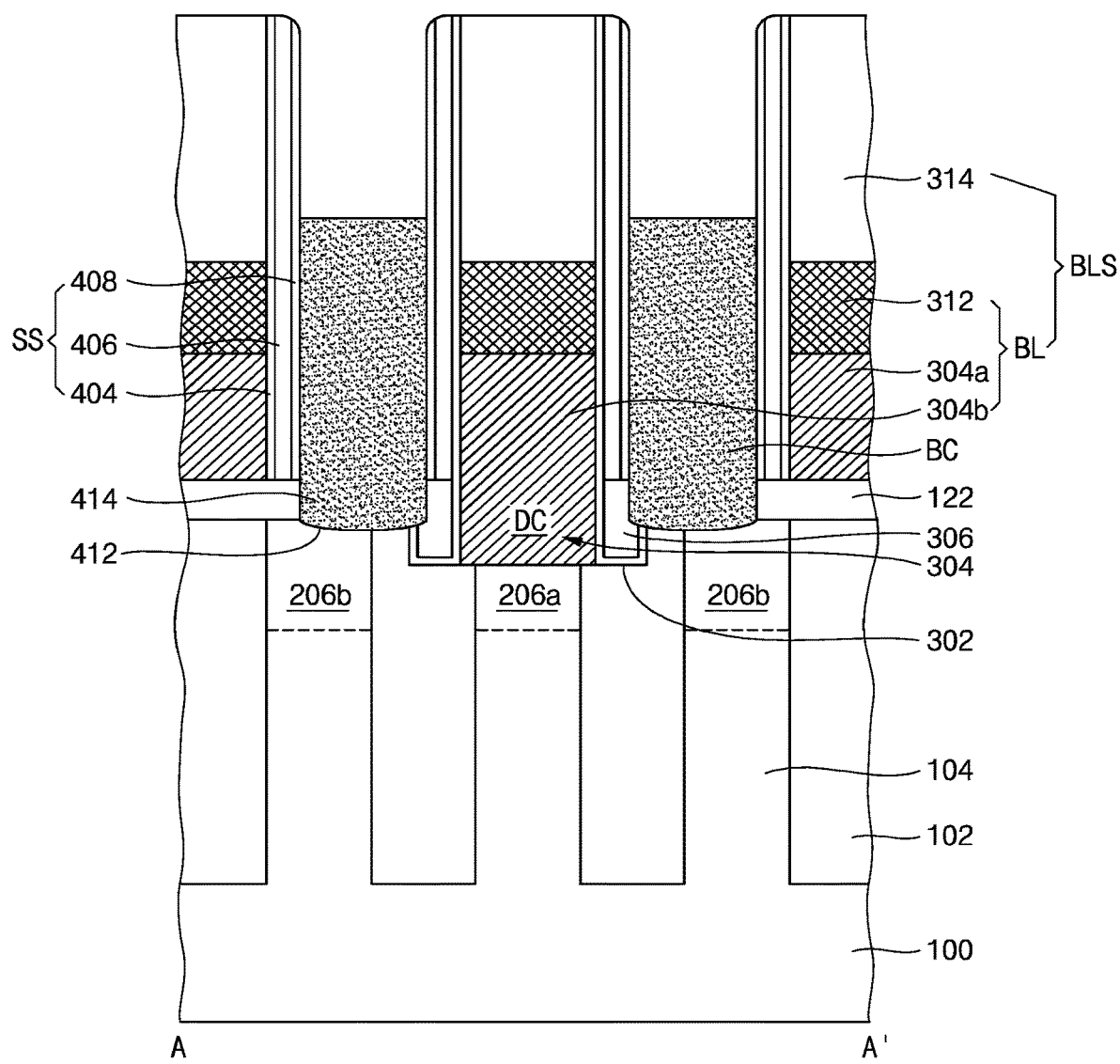
Figure 6C:
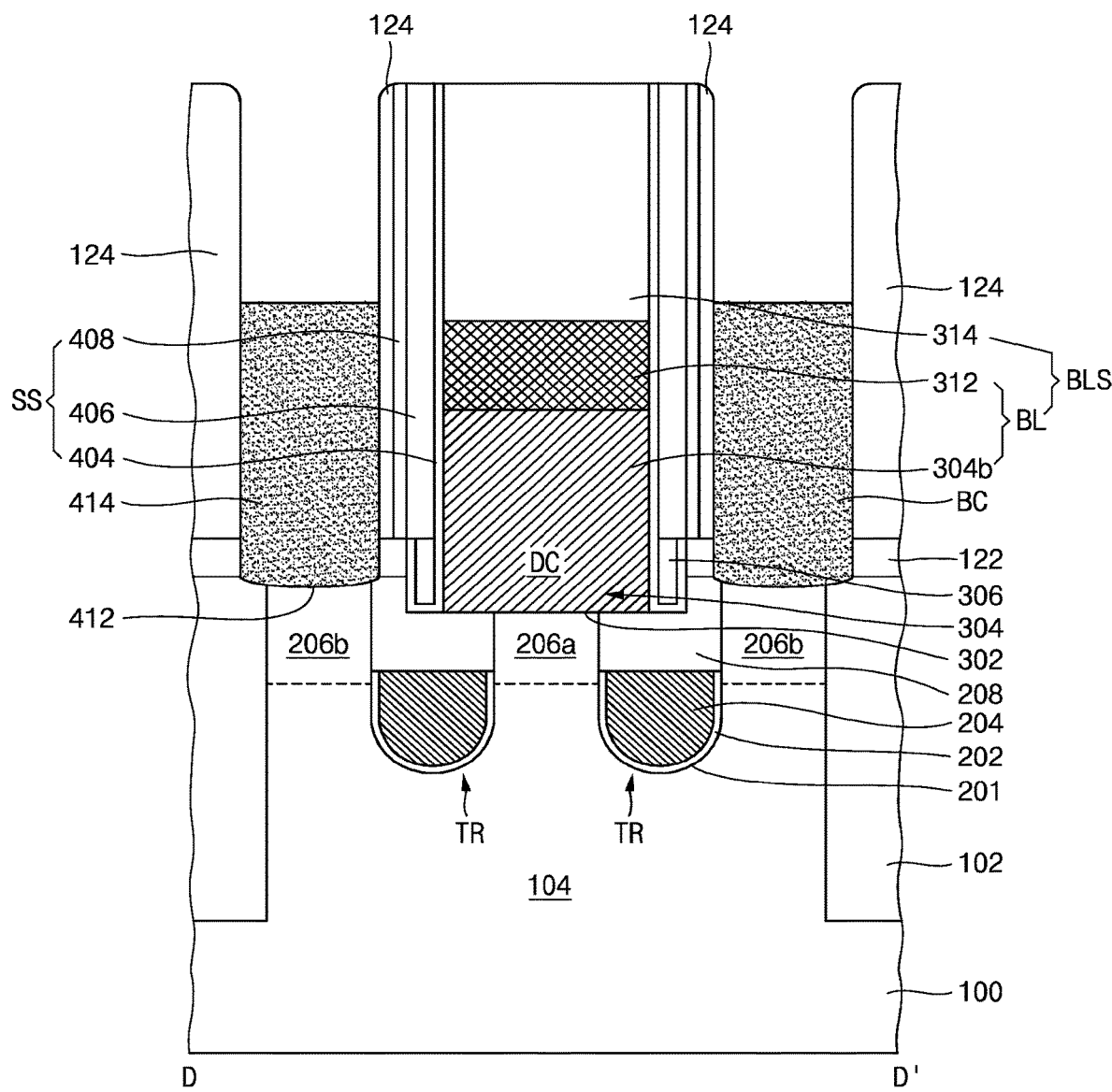

Referring to FIGS. 6A to 6C, an insulating fence 124 may be formed by stacking an insulation film on the entire surface of the substrate 100 having the first to third spacers 404, 406, and 408 thereon and patterning the insulation film. The insulating fence 124 may be formed to vertically overlap the gate capping film 208. The insulating fence 124 may be formed between the adjacent bit line structures BLS in the second direction D2 to be connected to a pair of spacer structures SS facing each other. Thus, a second contact hole 412 may be formed in a space surrounded by the second insulating fence 124 and the third spacer 408 which is an outermost one of the spacer structure SS. The second contact hole 412 may be between two directly adjacent bit line structures BLS, as illustrated in FIG. 6A. In one embodiment, the insulating fence 124 may be a nitride film.

In one embodiment, the second contact hole 412 may be expanded downward by further etching the substrate 100 and a portion of the upper part of the insulating spacer 306 using, as etch masks, the insulating fence 124 and the hard mask pattern 314 which is the upper part of the bit line structure BLS. A second contact plug 414 may be formed by burying a conductive material in the second contact hole 412. In one embodiment, the second contact plug 414 may be formed by forming a polysilicon film on the entire surface of the substrate 100 having the second contact hole 412 thereon and etching the polysilicon film. The polysilicon film may be doped with impurities. The polysilicon film may be formed using, for example, a physical or chemical deposition process. A first etching process performed on the polysilicon film is an isotropic etching process and may be a full-surface etch-back process. In one embodiment, an upper surface of the second contact plug 414 may be formed to be at a higher level than an upper part of the metal-containing layer 312 of the bit line BL.

Figure 7A:
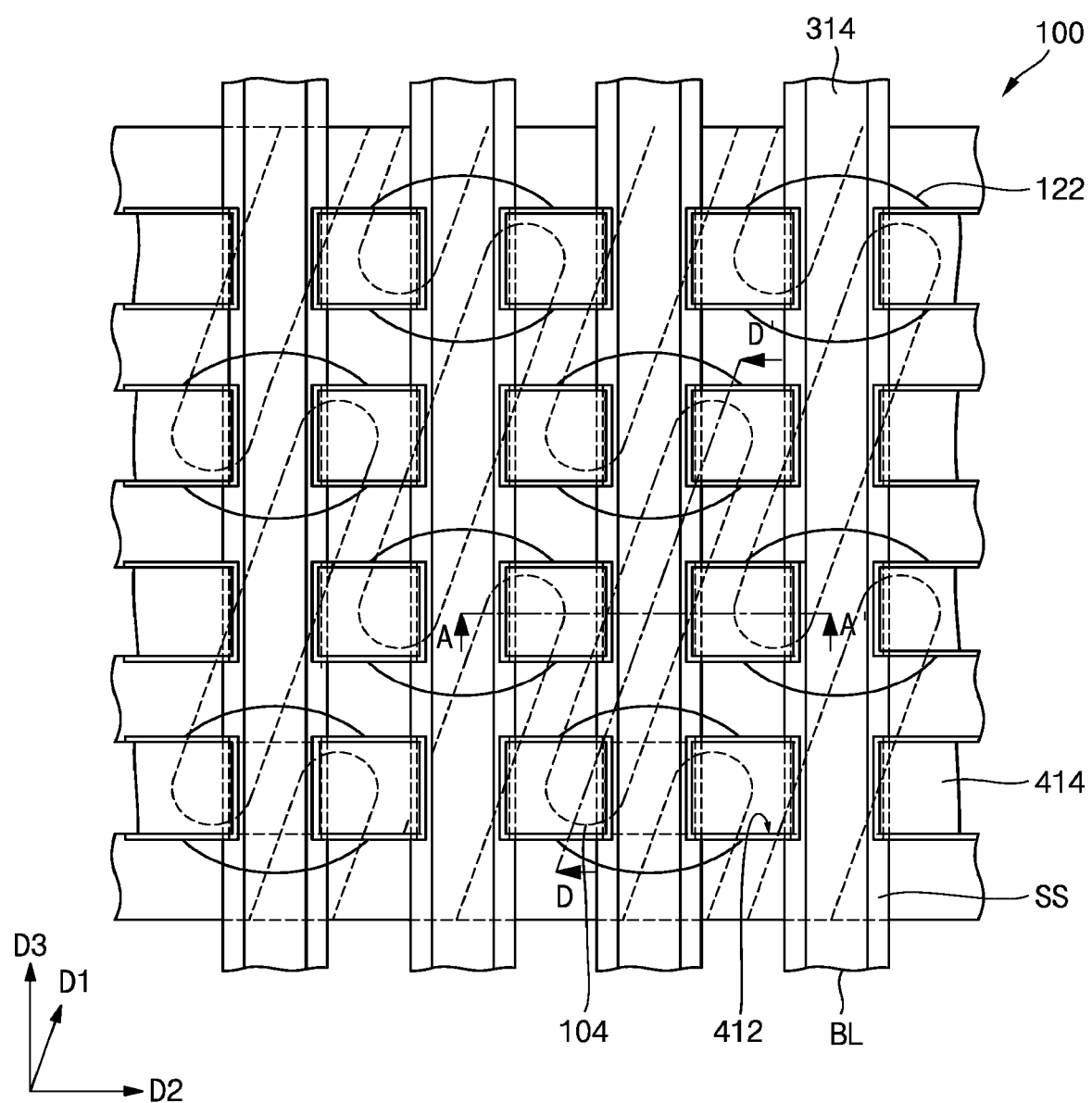
Figure 7B:
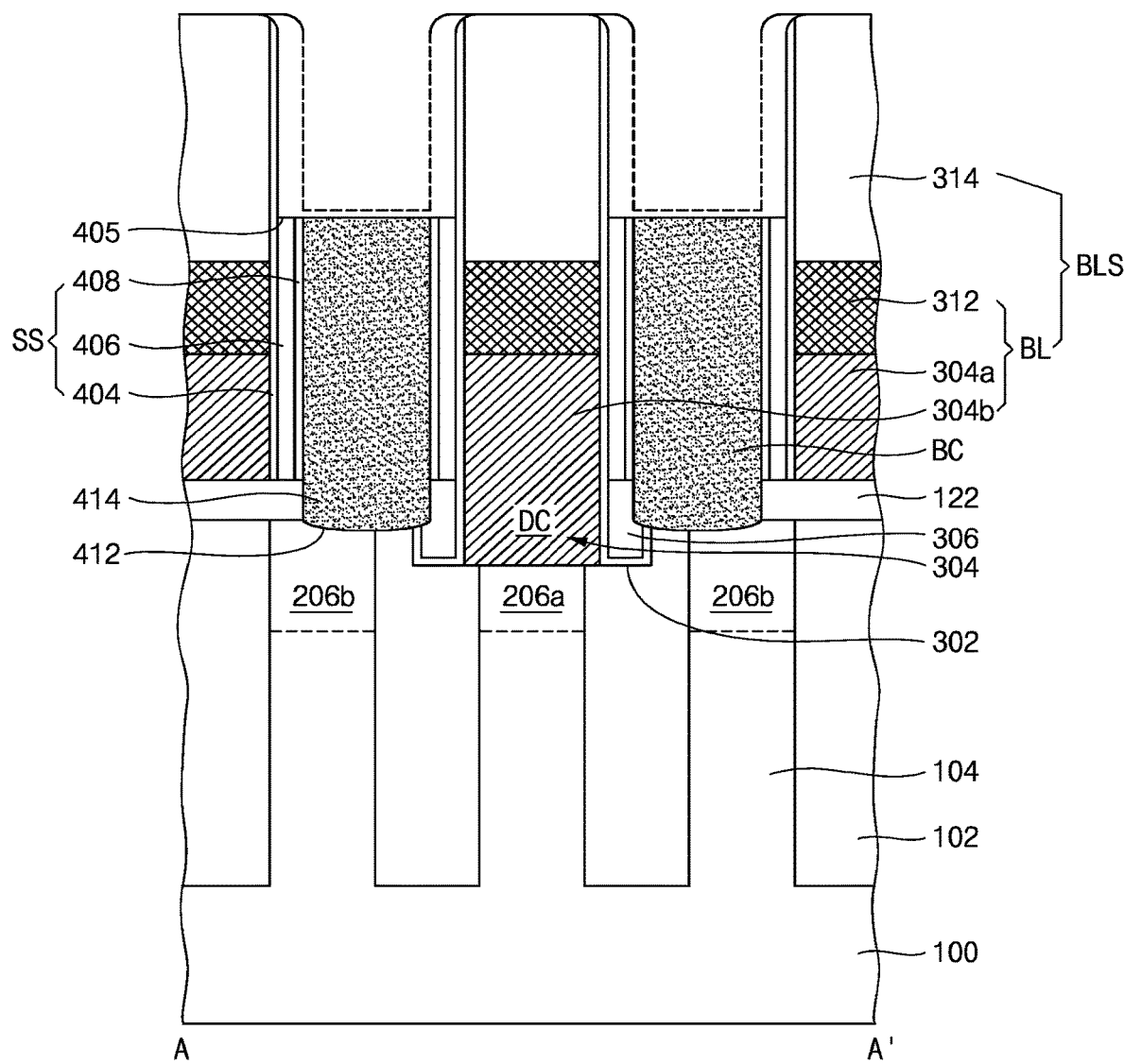
Figure 7C:
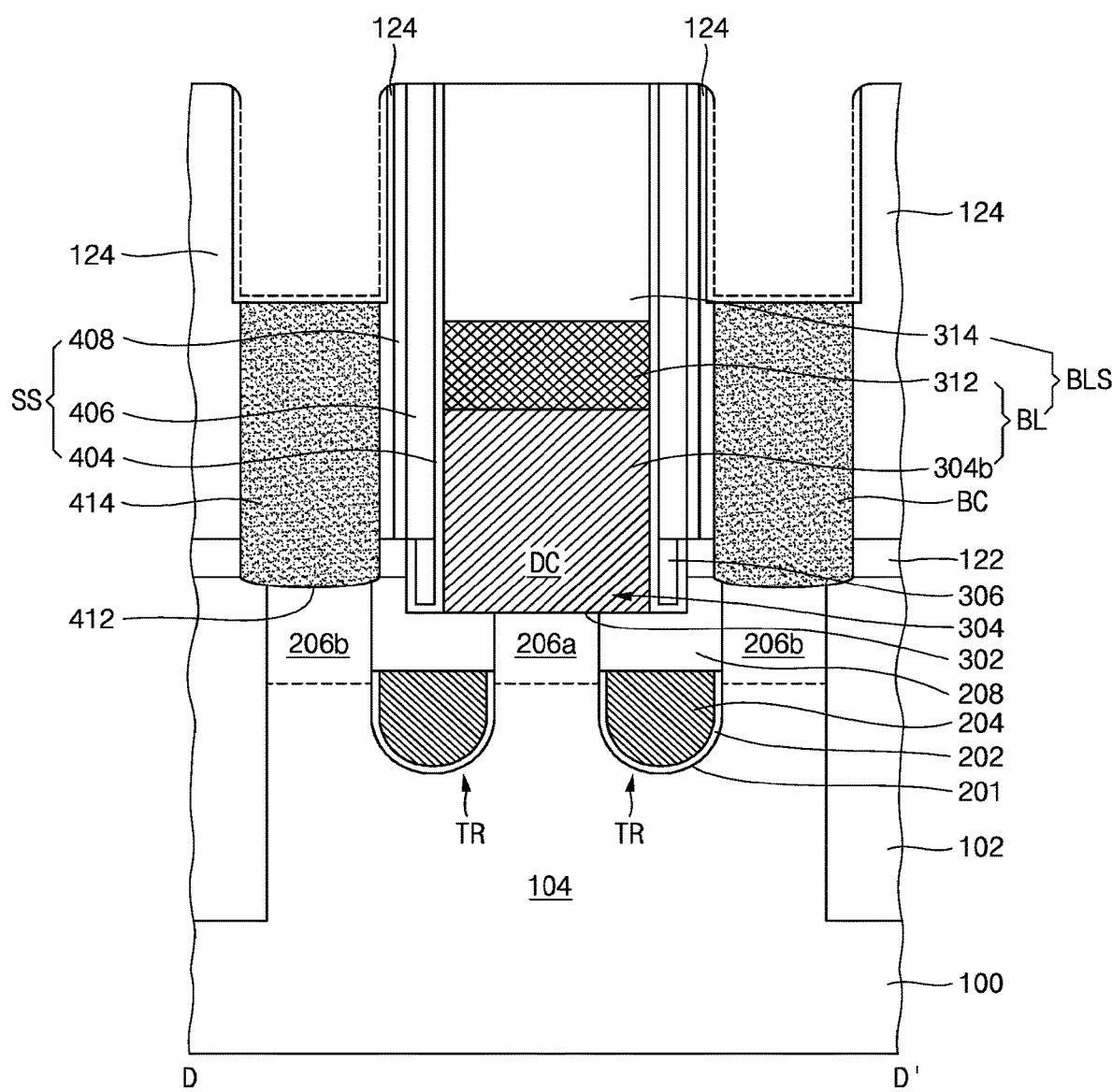

Referring to FIGS. 7A to 7C, an expansion part 405 may be formed by expanding an upper part of the second contact hole 412, specifically by removing upper portions of spacer structures SS covering upper parts of sidewalls of the bit line structure BLS using a second etching process. Each of the spacer structures SS extending on (e.g., covering the sidewalls of the bit line BL may have a triple-spacer structure including a nitride film (SiN), an oxide film ($SiO_x$), and a nitride film (SiN). The first and third spacers 404 and 408 which are nitride films may be formed on inner and outer sides of the spacer structure SS, and the second spacer 406 which is an oxide film may be formed between the first and third spacers 404 and 408. In one embodiment, the second spacer 406 may be thicker than the first and third spacers 404 and 408. The expansion part 405 may be formed by removing a portion of an upper part of the second spacer 406 and/or a portion of an upper part of the third spacer 408 (which are indicated by broken lines in FIGS. 7B and 7C) covering upper inner side surface of the second contact hole 412 using the second etching process. During the second etching process, an upper part of the second contact plug 414 buried in a lower part of the second contact hole 412 may be partially etched. The second etching process may be an isotropic etching process.

In one embodiment, a portion of the spacer structure SS (the upper part of the second spacer 406 and/or the upper part of the third spacer 408) may be removed using a wet etching process. In the wet etching process, a LAL solution, which is a mixture of hydrofluoric acid (HF) and ammonium fluoride ($NH_4F$) may be used as an etchant. The wet etching process may include a process of forming a polysilicon film on the substrate 100 and etching back the polysilicon film to form the second contact plug 414 in the second contact hole 412, a process of removing etch byproducts generated as the polysilicon film is etch-backed, and a process of etching and removing a portion of the spacer structure SS formed on upper parts of sidewalls of the metal-containing layer 312 of the bit line BL. Thus, a portion of the spacer structure SS covering the upper part of the second contact hole 412 may be removed to form the expansion part 405 on inner side surfaces of the second contact hole 412.

In one embodiment, a hydrofluoric acid (HF) solution and a phosphoric acid (LHP) solution may be used to perform an etching process on the spacer structure SS. The hydrofluoric acid solution may be a solution obtained by mixing deionized water and hydrofluoric acid at a ratio of 200:1 by volume. The etching process may include a process of forming the second contact plug 414 in the second contact hole 412 by forming a polysilicon film on the substrate 100 and etching back the polysilicon film, a process of removing etch byproducts generated as the polysilicon film is etch-backed, a process of etching and removing the spacer structure SS using a hydrofluoric acid solution, a process of etching the spacer structure SS using a phosphoric acid solution, and a process of etching the spacer structure SS again using the hydrofluoric acid solution. Accordingly, a portion of the spacer structure SS covering the upper part of the second contact hole 412 may be removed and thus the expansion part 405 may be formed on the lower part of the second contact hole 412.

In one embodiment, when an etching process is performed on the spacer structure SS, both a wet etching process using a hydrofluoric acid (HF) solution and a dry etching process may be performed. The hydrofluoric acid (HF) solution may be a solution obtained by mixing deionized water and hydrofluoric acid at a ratio of 200:1 by volume. In the dry etching process, an etching gas, such as $CF_4$, may be used. The etching process may include a process of forming the second contact plug 414 in the second contact hole 412 by forming a polysilicon film on the substrate 100 and etching back the polysilicon film, a process of removing etch byproducts generated as the polysilicon film is etch-backed, a process of etching the spacer structure SS using the hydrofluoric acid solution, a process of wet etching the spacer structure SS using the hydrofluoric acid solution, a process of dry etching the spacer structure SS, and a process of wet etching the spacer structure SS again using the hydrofluoric acid solution. Accordingly, a portion of the spacer structure SS covering the upper part of the second contact hole 412 may be removed and thus the expansion part 405 may be formed on the lower part of the second contact hole 412.

The LAL process described above may be advantageous in that either the hard mask layer 314 on the bit line structure BL or the second contact plug 414 which does not include polysilicon is less influenced by etching and the number of processes may not increase. In contrast, the LAL solution may have an excessively higher etch selectivity with respect to an oxide film than a nitride film. Thus, while the third spacer 408 which is a nitride film corresponding to an outer side of the spacer structure SS is etched, an air pocket may be generated in the second spacer 406 which is an intermediate oxide film. When the air pocket is generated in the second spacer 406 which is the intermediate oxide film, during a subsequent process of forming a landing pad 418 by burying a buried metal in the second contact hole 412 via the second spacer 406, a metal element of the buried metal may penetrate into the air pocket and thus a short-circuit failure may occur between the bit line BL and a storage node contact BC.

The etching process using the hydrofluoric acid solution and the phosphoric acid solution may be advantageous in that an air pocket may not be generated in the second spacer 406 which is the intermediate oxide film of the spacer structure SS. However, an etch rate of polysilicon when the phosphoric acid solution is used may be far higher than that of polysilicon when the LAL solution is used. When the phosphoric acid solution is used, polysilicon may be etched to a great extent during etching of the spacer structure SS formed on a sidewall of the bit line BL and thus a seam formed in the second contact plug 414 may expand. Thus, during a subsequent process, a metal silicide film ($CoSi_x$) may not be formed on the second contact plug 414 and thus contact resistance may increase. When the etching process using the hydrofluoric acid solution and the phosphoric acid solution is used, the number of processes may increase, and the hard mask layer 314 on the bit line structure BLS may be etched, thereby decreasing a height of the hard mask layer 314.

The etching process in which both the wet etching process using the hydrofluoric acid (HF) solution and the dry etching process are performed may be advantageous in that an air pocket may not be generated in the second spacer 406 which is the intermediate oxide film of the spacer structure SS. However, an etch rate of polysilicon is high and the height of the hard mask layer 314 may be decreased.

Thus, a new scheme for solving the problems described above may be beneficial. In one embodiment, the wet etching process using the hydrofluoric acid (HF) solution may be applied in a process of etching the spacer structure SS. The etching process may include a process of forming the second contact plug 414 in the second contact hole 412 by forming a polysilicon film on the substrate 100 and etching back the polysilicon film, a process of removing etch byproducts generated as the polysilicon film is etch-backed, a process of etching the upper parts of the second and third spacers 406 and 408 of the spacer structure SS using the hydrofluoric acid solution, and a process of forming a fourth spacer 409 on an outer side surface of the first spacer 404 exposed by etching the second and third spacers 406 and 408.

In order to not generate an air pocket in the second spacer 406 which is the intermediate oxide film, a process of etching the third spacer 408 which is a nitride film on an outer side of the second spacer 406 other than the second spacer 406 may need to be improved. An anisotropic etching process may be performed twice on the third spacer 408 which is a nitride film covering upper parts of side walls of the bit line BL. The anisotropic etching process may include an etching process for forming the spacer structure SS and an etching process for forming a polysilicon film. When the anisotropic etching process is performed twice on the third spacer 408 which is the nitride film, the third spacer 408 may be damaged to a certain degree. As appreciated by the inventors of the present disclosure the third spacer 408 which is the nitride film shows higher etching reactivity with respect to an etchant containing hydrofluoric acid (HF) or a fluorine atom (F—). As the pH of such etch species becomes lower, the third spacer 408 which is the nitride film may be etched more quickly. In one embodiment, an etchant containing hydrofluoric acid (HF) or a fluorine atom (F—) may have a pH of about 3 or less. As the etching of the third spacer 408 which is the nitride film is completed more quickly, the etching process may be completed earlier, and the second spacer 406 which is the intermediate oxide film may be suppressed from being additionally etched. An etch selectivity with respect to an oxide film may be controlled to be decreased.

In one embodiment, an etch selectivity of an etchant with respect to an oxide film ($SiO_x$) may be controlled to be ten times less than that of the etchant with respect to a nitride film (SiN). The etchant may be controlled to decrease an etch rate of the polysilicon film to be etched together with the second spacer 406 and/or the third spacer 408 according to the etching process. In one embodiment, the etch rate of polysilicon when the etchant is used may be controlled to be one tenth of that of polysilicon or less when phosphoric acid is used. In one embodiment, the etchant may be a hydrofluoric acid solution which is a mixture of deionized water and hydrofluoric acid (HF) at a ratio of 30:1 by volume or a hydrofluoric acid mixed solution having a selectivity controlled to be within a predetermined range by adding an organic solvent such as $NH_4F$ thereto. Various types of etchants may be selected in consideration of a selectivity, pH level, concentration, a process time, an etch rate of a hard mask layer and/or an etch rate of polysilicon, and so on. Both a wet etching process using an etchant and a dry etching process may be performed.

In the etching process described above, an air pocket may not be generated in the second spacer 406 which is the intermediate oxide film after the second etching process is performed to remove upper parts of sidewalls of the second and third spacers 406 and 408, thereby reducing or possibly preventing a short-circuit failure between the bit line BL and the storage node contact BC. In the present disclosure, a state in which an inflection portion or a singularity, such as an air pocket, the density of which discontinuously changes or which is differentiated from other parts, is not be generated inside the second spacer 406 which is the intermediate oxide film and/or the third spacer 408 which is an outer nitride film or below the expansion part 405 as described above may be defined to be a substantially homogeneous state. In one embodiment, each of the second spacer 406 and the third spacer 408 may be substantially devoid of vacancies (e.g., a void, an air gap, an air pocket) and may have a uniform density.

According to the improved process scheme as described above, the expansion part 405, which is defined by the upper surfaces of the second spacer 406 which is the intermediate oxide film and the third spacer 408 which is the outer nitride film, may be formed by etching as illustrated in FIGS. 2C to 2E such that the upper surfaces of the second spacer 406 and the upper surface of the third spacer 408 may have flat surfaces and may be substantially coplanar with each other. Even if irregularities may partially occur in the second spacer 406, a depth of an etched concave part may be controlled to be within a range which does not degrade insulation between the bit line BL and the storage node contact BC. In one embodiment, the depth of the concave part may be controlled to be about 10 nm or less. In one embodiment, the depth of the concave part may be controlled to be about 5 nm or less, and the upper surfaces of the second spacer 406 and the third spacer 408 may be substantially flat. Even if the concave part is formed, portions of the barrier film 417 and the conductive film 418 in the concave part may be maintained to have a homogeneous state as described above.

In one embodiment, the expansion part 405 may be located at a high level by controlling etch rates of the upper parts of the sidewalls of the second and third spacer 406 and 408. Thus, the distance between an edge part of a lower end of the landing pad 418 on an etched surface of the expansion part 405 and the metal-containing layer 312 of the bit line BL below the expansion part 405 may be increased. Accordingly, a length of a path though which a metal element of a buried metal flowing from the landing pad 418 permeates below the expansion part 405 via the etched surface may be increased, thereby reducing or possibly preventing a short-circuit failure in the metal-containing layer 312 of the bit line BL. In one embodiment, the upper surface of the second contact plug 414 may be etched to be at a lower level than the expansion part 405 by performing an etching process on the upper parts of the sidewalls of the second and third spacers 406 and 408 and/or performing an additional etching process. Accordingly, a lower end of the landing pad 418 on the upper surface of the second contact plug 414 is covered by the third spacer 408 below the expansion part 405, and thus the metal element of the buried metal flowing from the lower end of the landing pad 418 may not diffuse into a portion below the expansion part 405 via the expansion part 405.

As described above, in a method of manufacturing a semiconductor device according to one embodiment of the present disclosure, a size of the landing pad 418 which is a conductive pattern for inputting/outputting data may be increased. Thus, even if misalignment or a process variation occurs during the manufacture of the semiconductor device, a sufficient process margin may be secured and thus the semiconductor device having improved reliability may be provided.

Figure 8A:
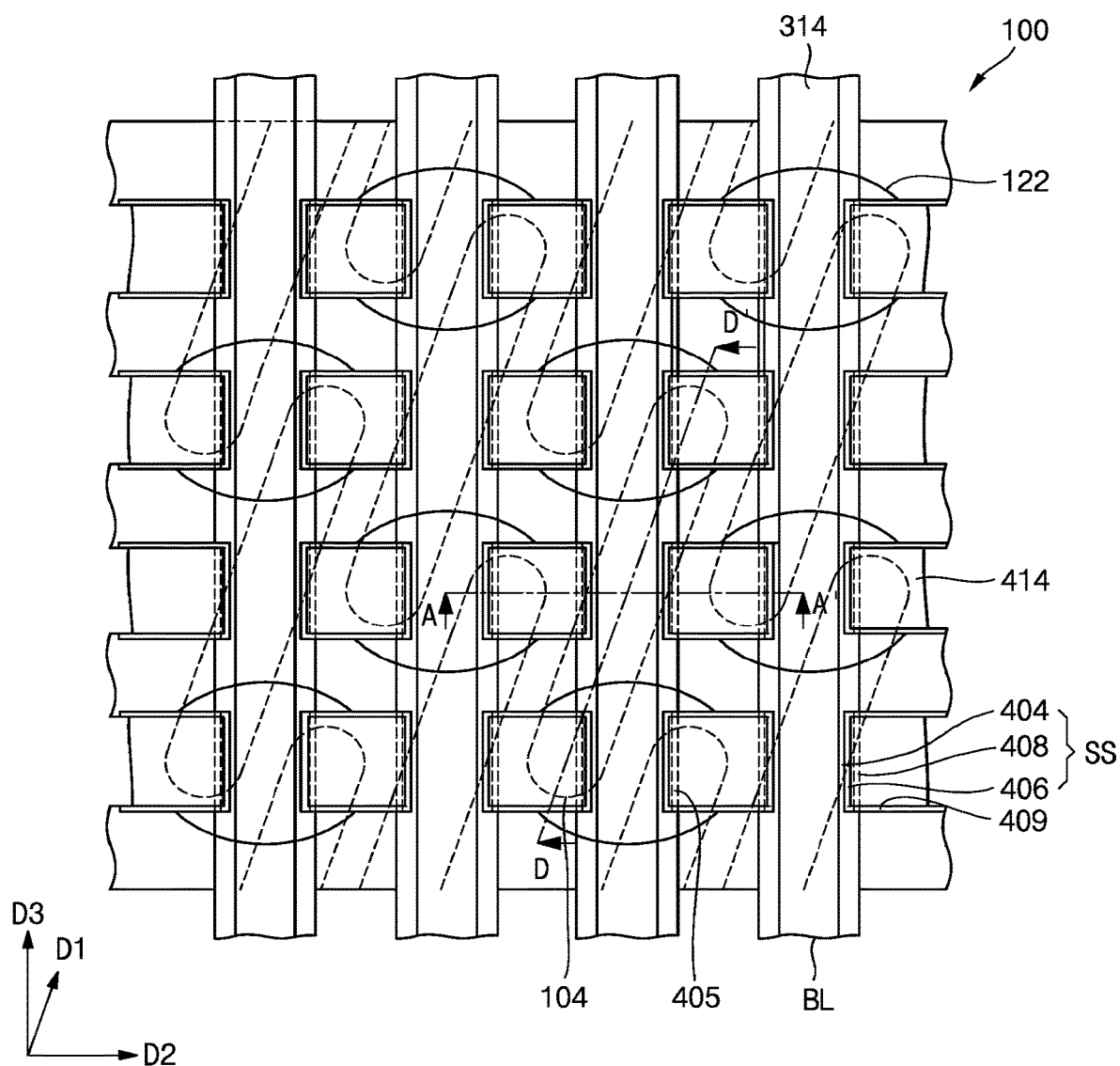
Figure 8B:
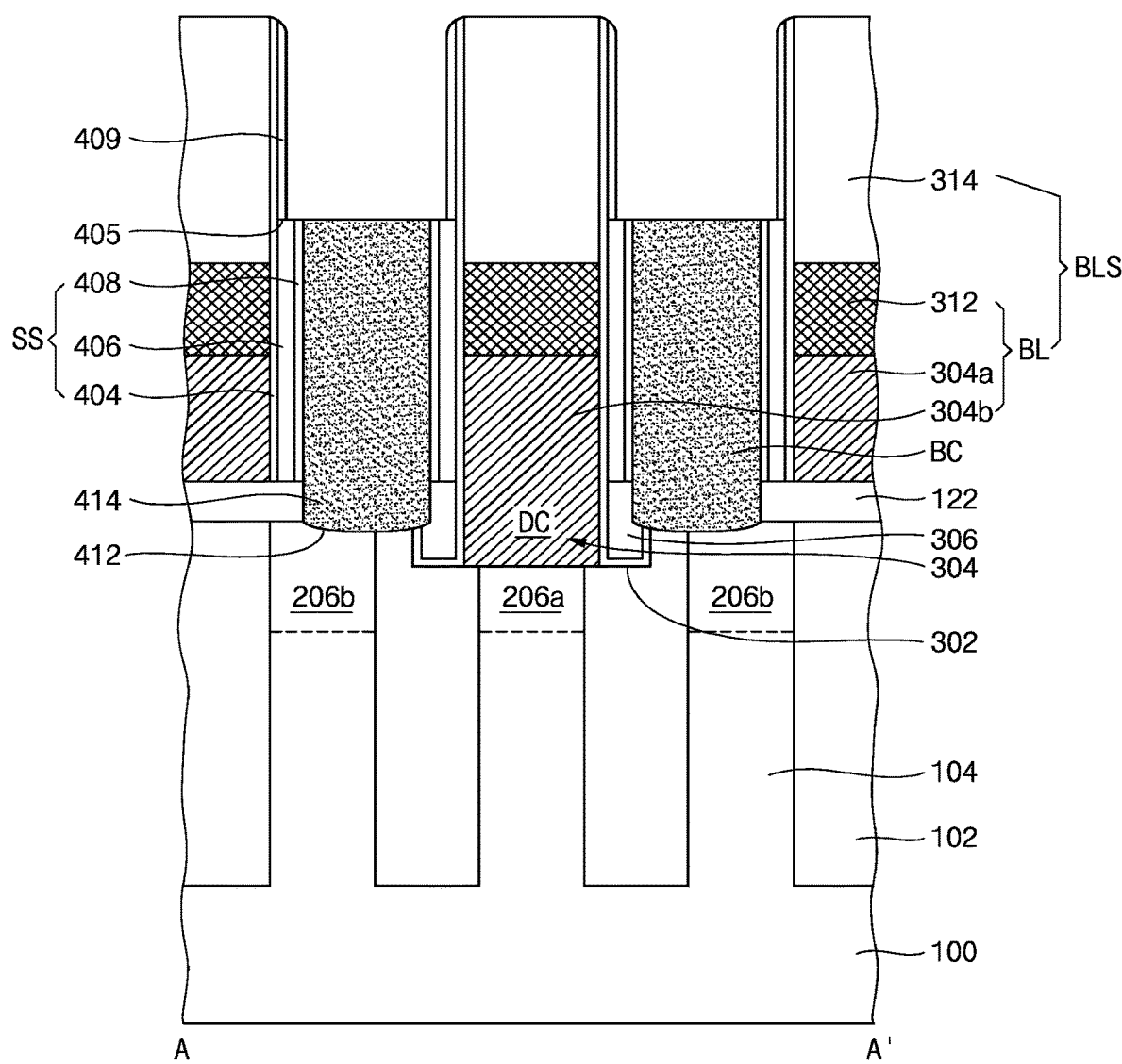
Figure 8C:
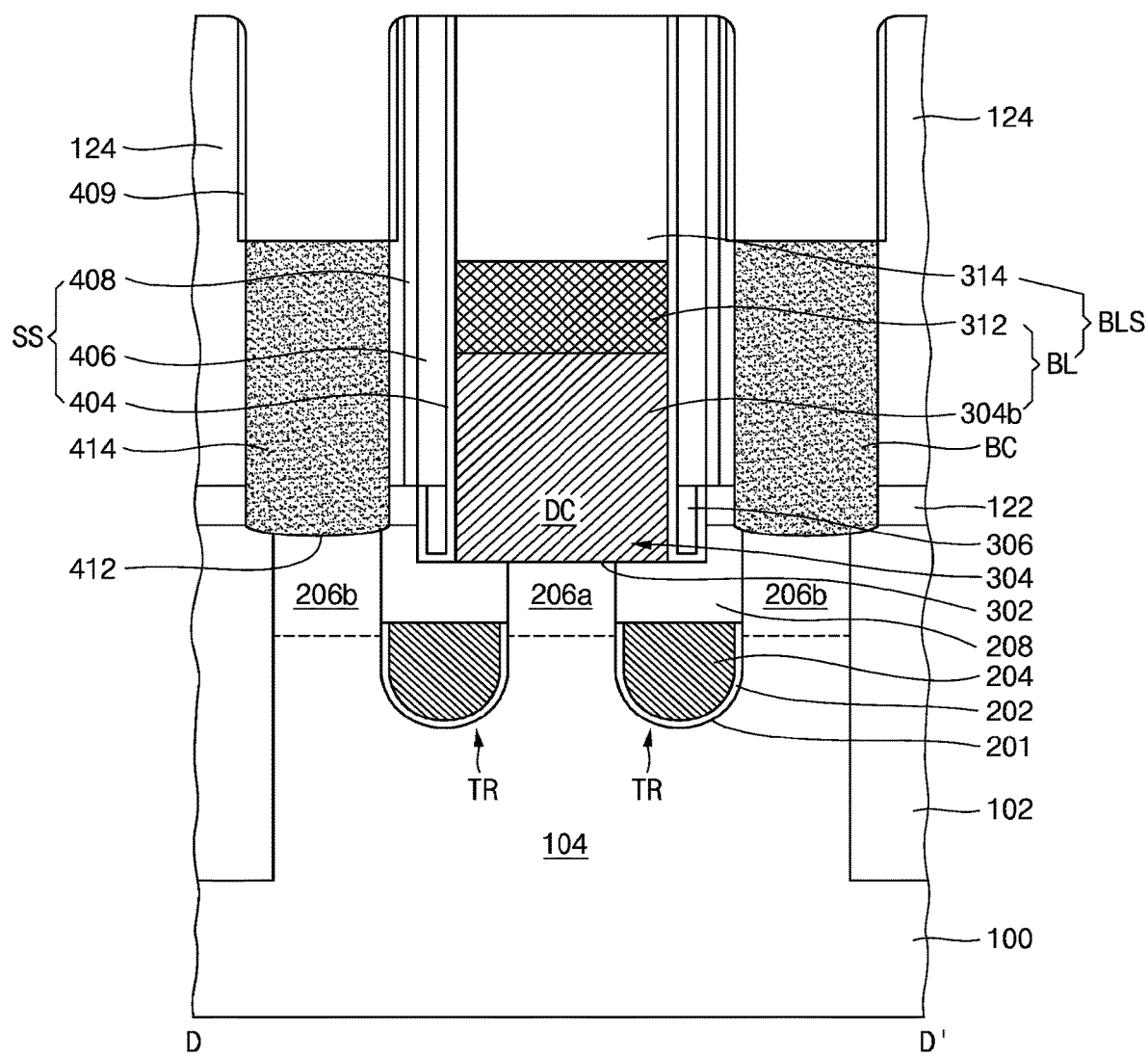

Referring to FIGS. 8A to 8C, after the second spacer 406 and/or the third spacer 408 of the spacer structure SS is etched, the fourth spacer 409 may be formed on an exposed outer side surface of the first spacer 404. Accordingly, at least a portion of the concave part is covered by the fourth spacer 409, and thus the fourth spacer 409 may serve as a diffusion-barrier wall and may reduce or possibly prevent a short-circuit failure due to diffusion of a metal element of a buried metal of the landing pad 418 to the metal-containing layer 312 of the bit line BL. In one embodiment, the fourth spacer 409 may be referred to as a capping layer. The forming of the fourth spacer 409 may include a thin-film forming process and an anisotropic etching process. In one embodiment, a fifth spacer (not shown) may be conformally formed on the fourth spacer 409. The fifth spacer may be formed in a shape entirely covering the first to fourth spacers 404, 406, 408, and 409. The fifth spacer may function as a passivation layer for reducing or possibly preventing damage on the spacer structure SS and/or the contact plug 414 during a subsequent process. The fifth spacer may be a sacrificial layer to be removed in a subsequent etching process. The fifth spacer may be entirely removed by etching but a portion thereof may not be removed and thus may remain on the fourth spacer 409. In this case, the fifth spacer may cover at least a portion of an etched surface of the second spacer 406, similar to the fourth spacer 409. The fifth spacer may include the insulating material described above. In one embodiment, the fifth spacer may be a nitride film having a thickness of about 2 nm or less.

Figure 9A:
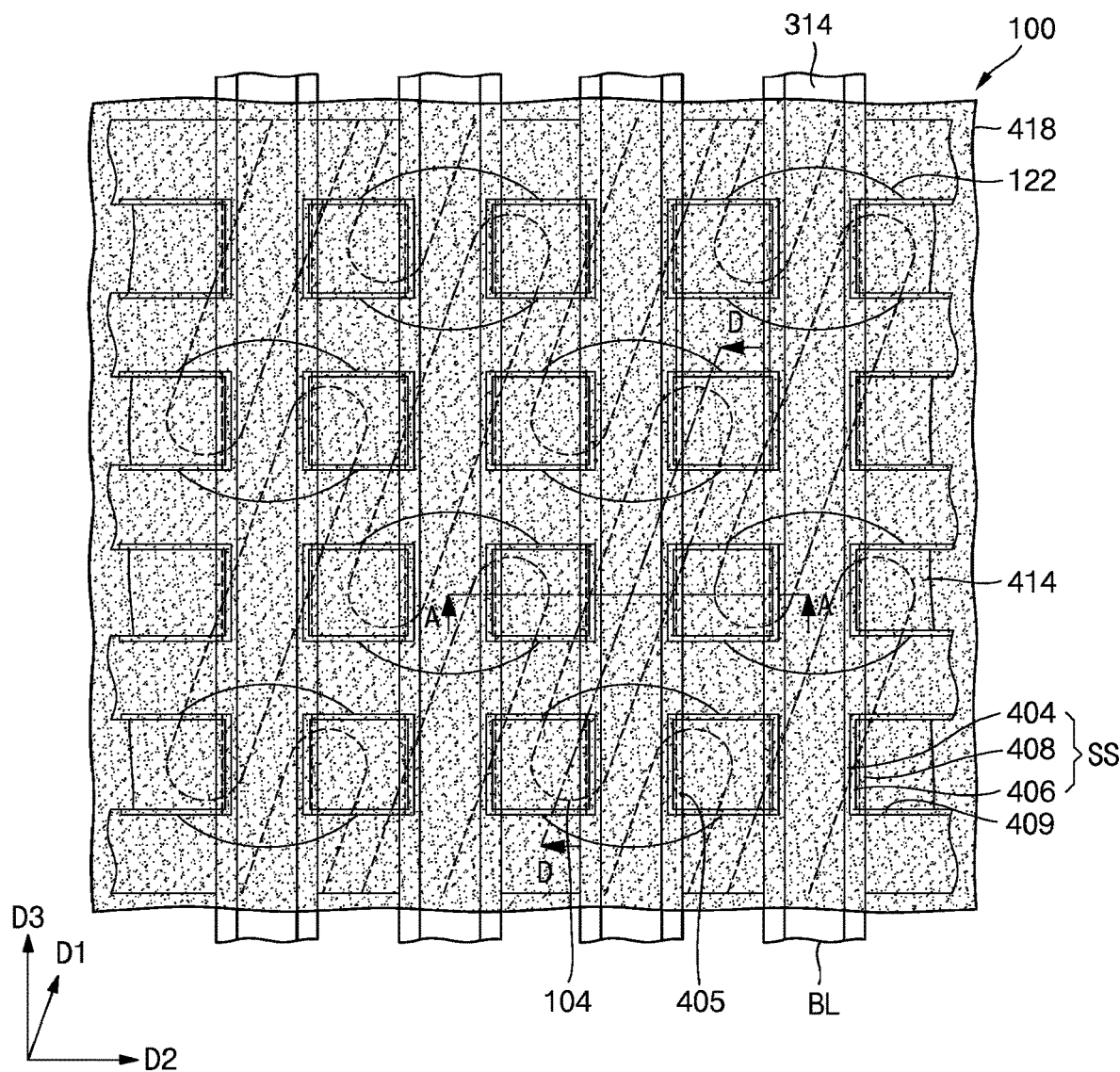
Figure 9B:
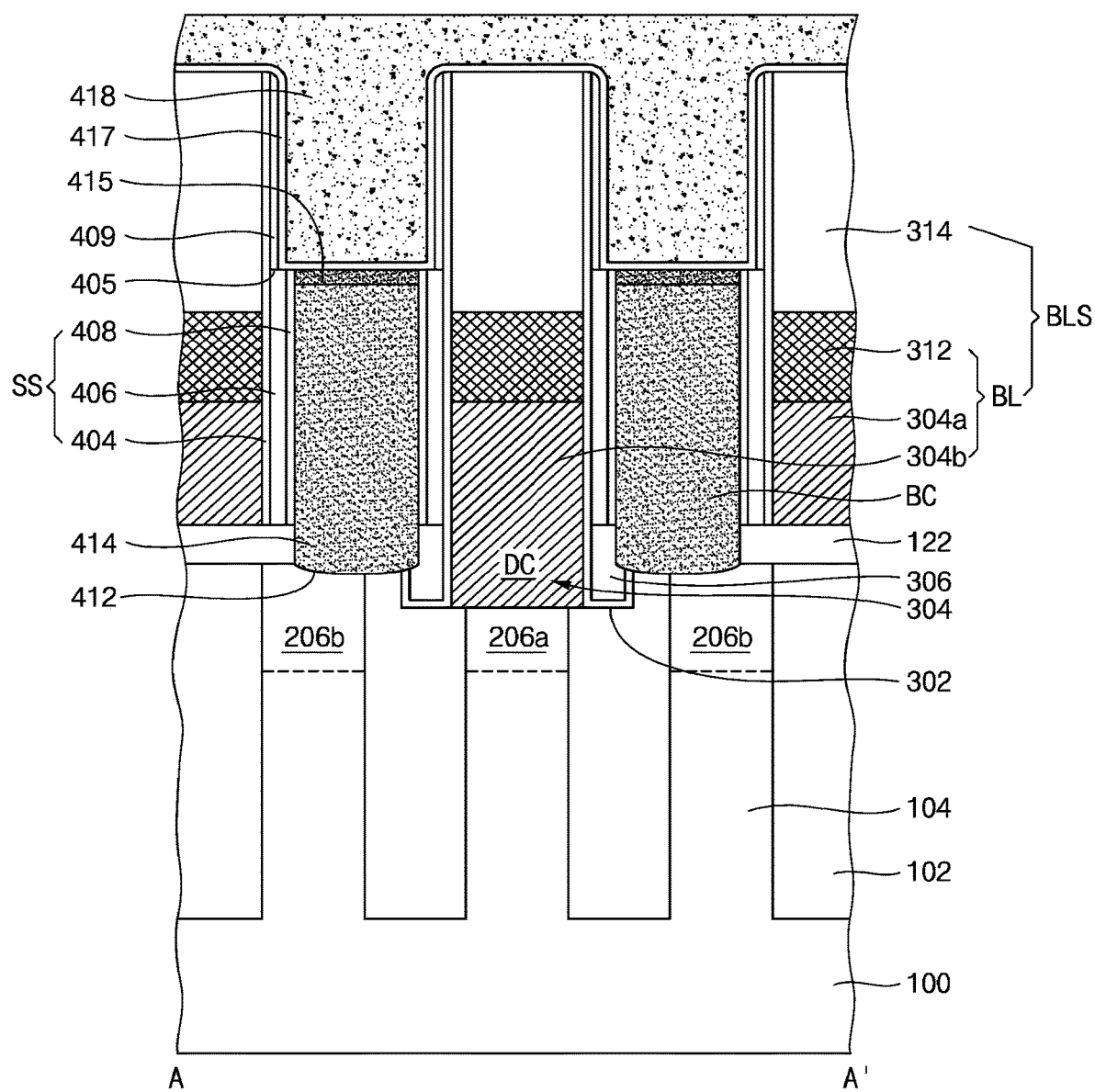
Figure 9C:
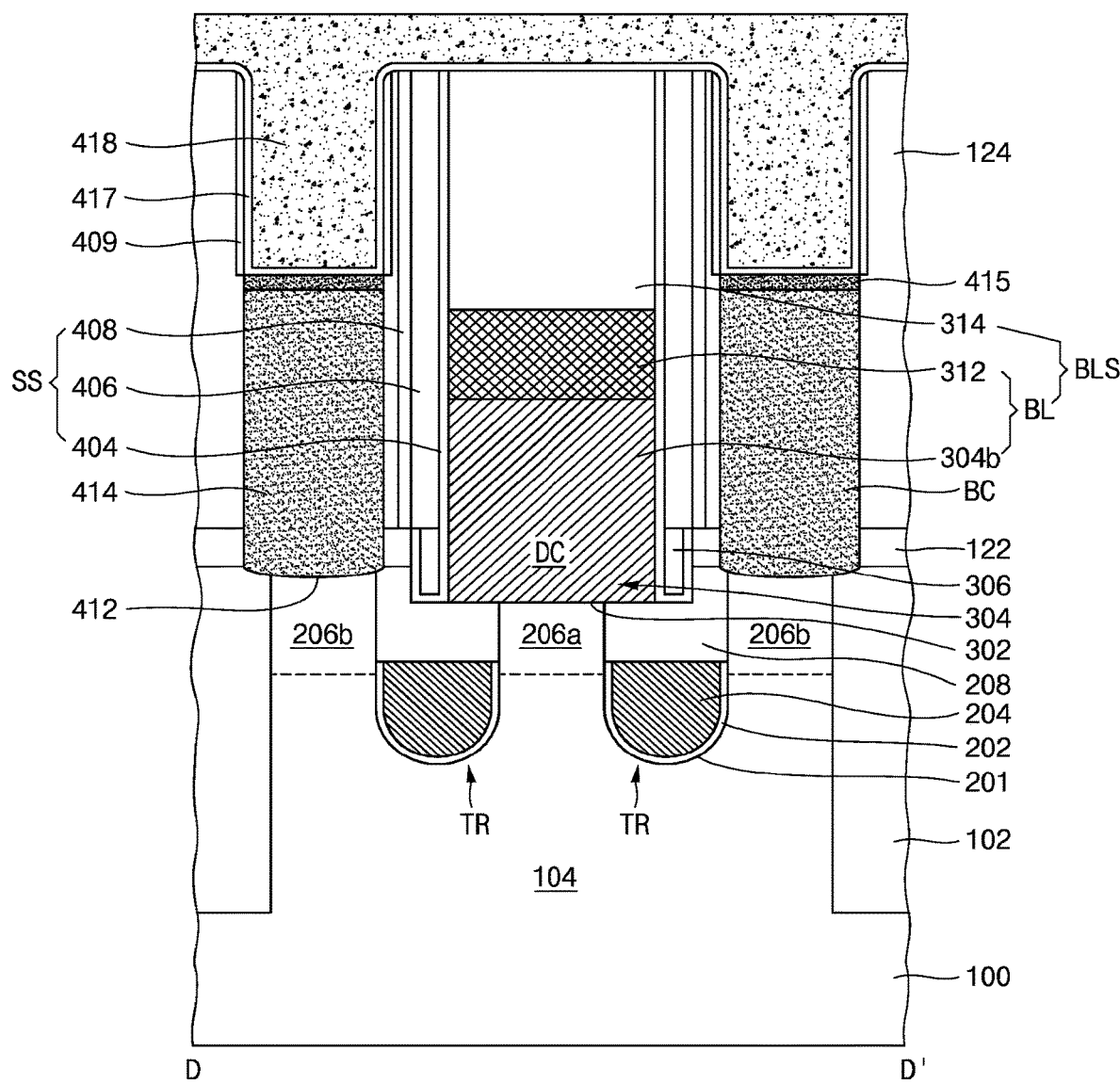

Referring to FIGS. 9A to 9C, a metal silicide film 415 may be formed by conformally forming a metal film on the entire surface of the substrate 100 having the fourth spacer 409 and/or the fifth spacer thereon and performing a heat treatment process (e.g., a rapid heat treatment process) to react the metal film with the upper part of the second contact plug 414. A portion of the metal film which does not change into the metal silicide film 415 may be removed.

A barrier film 417 may be conformally formed on the entire surface of the substrate 100. In one embodiment, the barrier film 417 may include titanium nitride. A conductive film 418 filling the inside of the second contact hole 412 may be formed on the entire surface of the substrate 100 having the barrier film 417 thereon. The conductive film 418 may include a metal such as tungsten or titanium nitride. A cross section of the conductive film 418 located on the second contact hole 412 may have roughly a "T" shape.

Figure 10A:
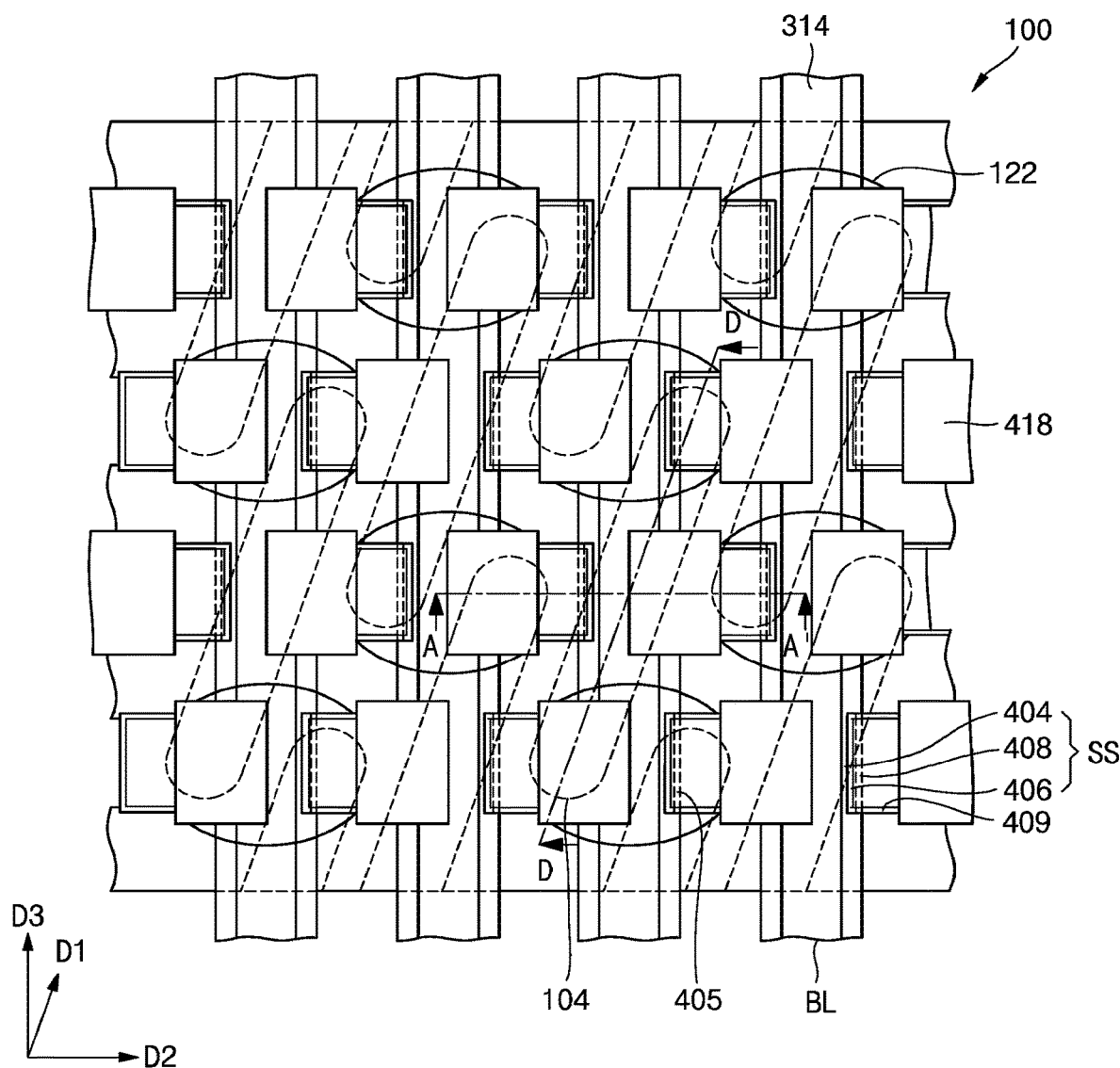
Figure 10B:
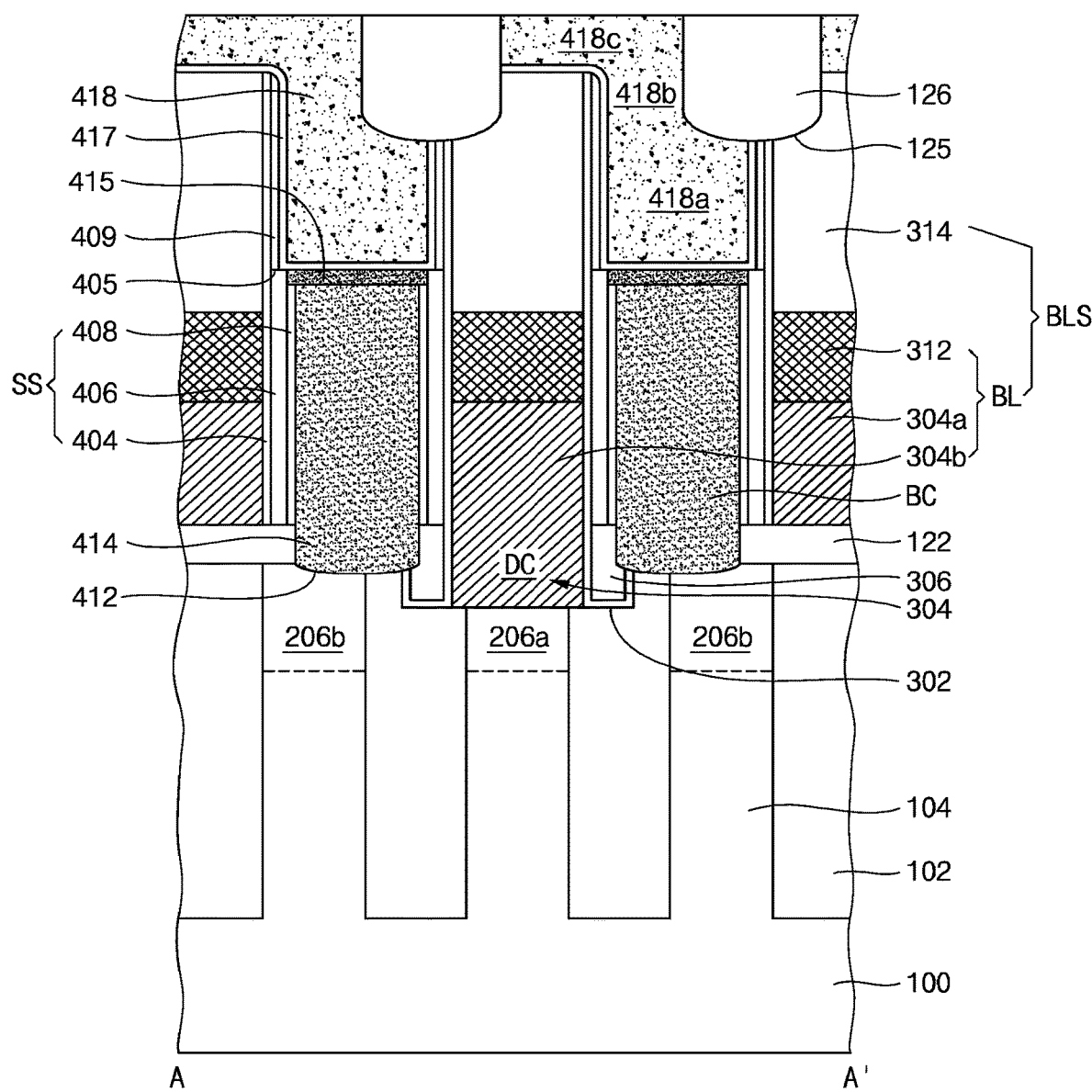
Figure 10C:
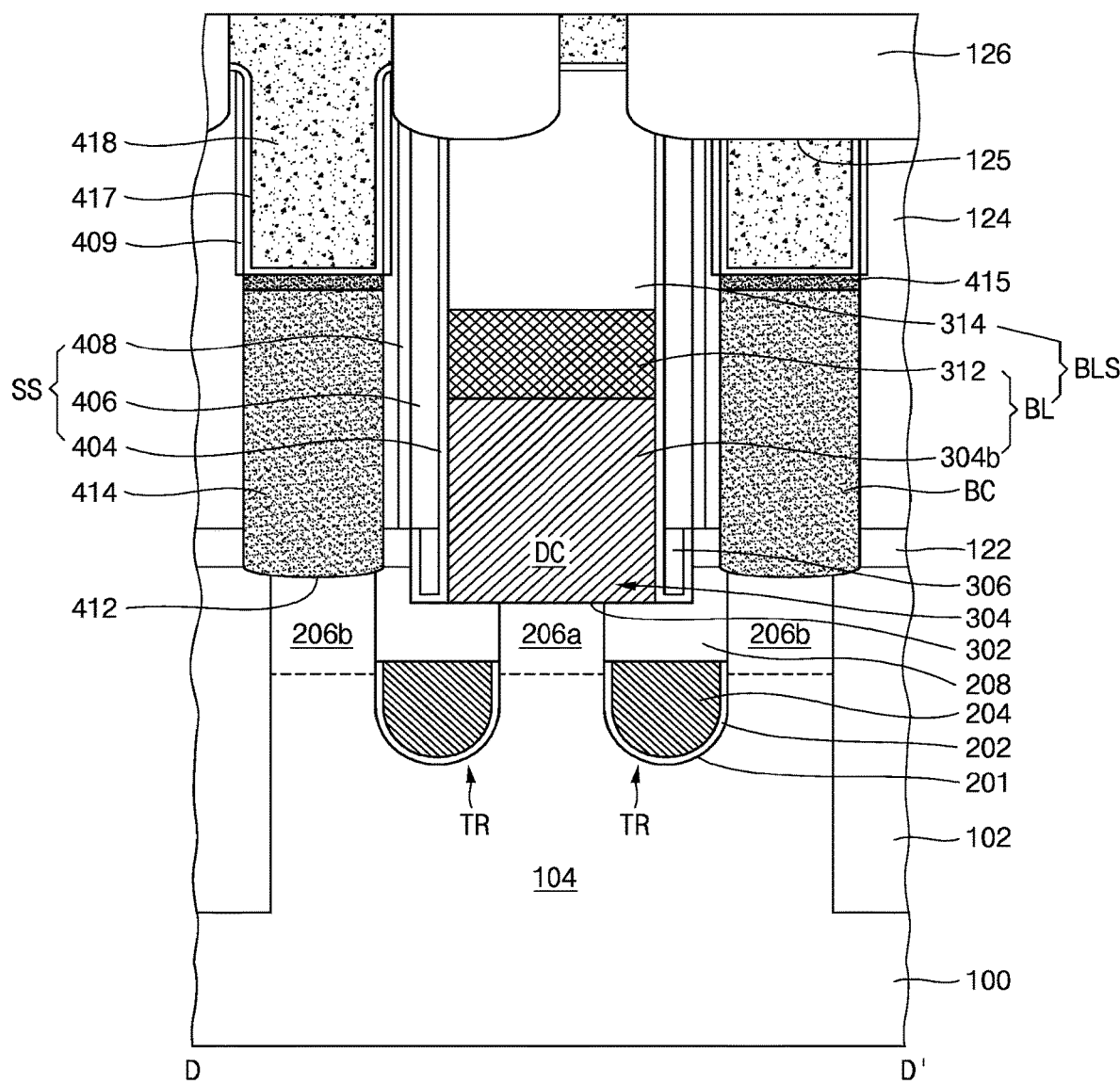

Referring to FIGS. 10A to 10C, the landing pad 418 may be formed by forming a mask pattern on the conductive film 418. The landing pad 418 may be electrically connected to the second contact plug 414 with the barrier film 417 and the metal silicide film 415 interposed therebetween, thereby forming a buried contact BC. A portion of the conductive film 418 which is not covered with the mask pattern and portions of the barrier film 417, the hard mask pattern 314, the spacer structure SS, and the insulating fence 124 below the conductive film 418 may be removed. When viewed from the plan view, a pad part 418c may be shifted from a contact part 418a in the second direction D2. A recess 125 may be filled with a second interlayer insulating film 126.

Referring back to FIGS. 1A to 1E, the pad part 418c may be exposed by forming an etch stop film 129 thereon and patterning the etch stop film 129. The capacitor CAP may be formed by sequentially forming a lower electrode 502, a dielectric layer 504, and an upper electrode 506 on the exposed pad part 418c. Thus, a semiconductor device as illustrated in FIGS. 1A to 1E may be obtained.

Figure 11:
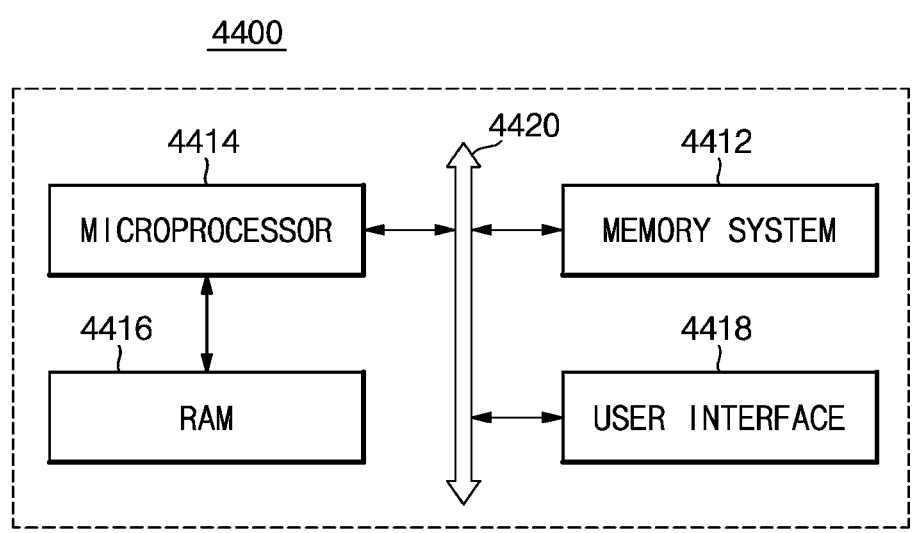
FIG. 11 is a block diagram of an electronic system including a semiconductor device according to one embodiment of the present disclosure.

FIG. 11 is a block diagram of an electronic system 4400 including a semiconductor device according to one embodiment of the present disclosure.

Referring to FIG. 11, the electronic system 4400 may include a memory system 4412, a microprocessor 4414, a random access memory (RAM) 4416, a user interface 4418, and a bus 4420. The microprocessor 4414 may program and control the electronic system 4400. The RAM 4416 may be used as an operating memory of the microprocessor 4414.

The microprocessor 4414, the RAM 4416 and/or other components may be assembled in a single package. Data may be input to or output from the electronic system 4400 via the user interface 4418. The memory system 4412 may store code for operating the microprocessor 4414, data processed by the microprocessor 4414, or data input from the outside. Although not shown, the memory system 4412 may include a controller and a memory.

The electronic system 4400 is applicable to a mobile device or a computer. According to embodiments of the present disclosure, the semiconductor device described above with reference to FIGS. 1A to 10C may be included in at least one among the RAM 4416, the memory system 4412, and the microprocessor 4414, thereby contributing to improvement of the cost-effectiveness of the electronic system 4400.

According to the present disclosure, highly integrated semiconductor devices having improved reliability, methods of manufacturing the same, and electronic devices including the same may be provided.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
    a substrate including a device isolation layer defining an active region;
    a bit line structure crossing the active region and including a conductive line pattern and a capping line pattern on the conductive line pattern;
    a first contact structure on the active region and the device isolation layer, the first contact structure including a top surface that is lower than a top surface of the capping line pattern of the bit line structure;
    a second contact structure on the first contact structure, the second contact structure including a first portion and a second portion that is on the first portion and extends on the top surface of the capping line pattern of the bit line structure;
    a spacer structure between the bit line structure and at least one of the first contact structure and the second contact structure, the spacer structure including a first spacer on a side of the bit line structure and a second spacer between the first spacer and the at least one of the first contact structure and the second contact structure; and
    a capacitor on the second portion of the second contact structure, the capacitor including a lower electrode, an upper electrode and a dielectric layer between the lower electrode and the upper electrode,
    wherein a top surface of the first spacer is higher than a top surface of the second spacer,
    a bottom surface of the first portion of the second contact structure is on the top surface of the second spacer, and
    a width of the first portion of the second contact structure is greater than a width of the first contact structure.

2. The semiconductor device of claim 1, wherein the top surface of the first contact structure is substantially coplanar with the top surface of the second spacer.

3. The semiconductor device of claim 1, wherein the spacer structure includes a third spacer between the first spacer and the second spacer, and a top surface of the third spacer is substantially coplanar with at least one of the top surface of the second spacer and the top surface of the first contact structure.

4. The semiconductor device of claim 3, wherein the third spacer is thicker than the second spacer.

5. The semiconductor device of claim 3, wherein the spacer structure includes a fourth spacer between the first spacer and the second contact structure, and a bottom surface of the fourth spacer is substantially coplanar with the bottom surface of the first portion of the second contact structure and contacts the top surface of the third spacer.

6. The semiconductor device of claim 3, wherein the bottom surface of the first portion of the second contact structure contacts at least one of the top surface of the second spacer and the top surface of the third spacer.

7. The semiconductor device of claim 1, wherein the first contact structure includes a conductive plug and a metal silicide layer that is on the conductive plug, and the second contact structure includes a barrier layer that contacts the metal silicide layer of the first contact structure and a conductive metal layer that is on the barrier layer.

8. The semiconductor device of claim 7, wherein the spacer structure includes a third spacer between the first spacer and the second spacer and a fourth spacer between the first spacer and the second contact structure, and the barrier layer of the second contact structure contacts at least one among the top surface of the second spacer, a top surface of the third spacer and a side surface of the fourth spacer.

9. The semiconductor device of claim 1, wherein a top surface of the first portion of the second contact structure is substantially coplanar with the top surface of the capping line pattern of the bit line structure.

10. A semiconductor device comprising:
    a substrate including a device isolation layer defining an active region;
    a bit line structure crossing the active region, the bit line structure including a conductive line pattern and a capping line pattern on the conductive line pattern;
    a first contact structure on the active region and the device isolation layer, the first contact structure including a top surface that is lower than a top surface of the capping line pattern of the bit line structure;
    a second contact structure on the first contact structure, the second contact structure including a first portion and a second portion that is on the first portion and extends on the top surface of the capping line pattern of the bit line structure;
    a spacer structure between the bit line structure and at least one of the first contact structure and the second contact structure, the spacer structure including a first spacer on a side of the bit line structure and a second spacer between the first spacer and the at least one of the first contact structure and the second contact structure; and
    a capacitor on the second portion of the second contact structure, the capacitor including a lower electrode, an upper electrode and a dielectric layer between the lower electrode and the upper electrode,
    wherein a top surface of the first spacer is higher than a top surface of the second spacer,
    the top surface of the second spacer is higher than the top surface of the first contact structure,
    the first portion of the second contact structure includes a first bottom surface and a second bottom surface that is lower than the first bottom surface, the first bottom surface of the first portion of the second contact structure is on the top surface of the second spacer, and the second bottom surface of the first portion of the second contact structure is on the top surface of the first contact structure, and a width of the first portion of the second contact structure is greater than a width of the first contact structure.

11. The semiconductor device of claim 10, wherein the first bottom surface of the first portion of the second contact structure is substantially coplanar with the top surface of the second spacer, and the second bottom surface of the first portion of the second contact structure is lower than the top surface of the second spacer.

12. The semiconductor device of claim 10, wherein the spacer structure includes a third spacer between the first spacer and the second spacer, and the second bottom surface of the first portion of the second contact structure is lower than a top surface of the third spacer.

13. The semiconductor device of claim 12, wherein the top surface of the third spacer is substantially coplanar with the top surface of the second spacer.

14. The semiconductor device of claim 12, wherein the spacer structure includes a fourth spacer between the first spacer and the second contact structure, and a bottom surface of the fourth spacer contacts the top surface of the third spacer.

15. A semiconductor device comprising:
a substrate including a device isolation layer defining an active region;
a bit line structure crossing the active region, the bit line structure including a conductive line pattern and a capping line pattern on the conductive line pattern;
a first contact structure on the active region and the device isolation layer, the first contact structure including a top surface that is lower than a top surface of the capping line pattern of the bit line structure;
a second contact structure on the first contact structure, the second contact structure including a first portion and a second portion that is on the first portion and extends on the top surface of the capping line pattern of the bit line structure;
a spacer structure between the bit line structure and at least one of the first contact structure and the second contact structure, the spacer structure including a first spacer that is on a side of the bit line structure and a second spacer between the first spacer and the at least one of the first contact structure and the second contact structure; and a capacitor on the second portion of the second contact structure, the capacitor including a lower electrode, an upper electrode and a dielectric layer between the lower electrode and the upper electrode,
wherein a top surface of the first spacer is higher than a top surface of the second spacer,
the top surface of the second spacer is substantially coplanar with the top surface of the first contact structure,
the first portion of the second contact structure includes a first bottom surface and a second bottom surface that is higher than the first bottom surface,
the first bottom surface of the first portion of the second contact structure is between the first spacer and the second spacer,
the second bottom surface of the first portion of the second contact structure is on the top surface of the second spacer and the top surface of the first contact structure, and
a width of the first portion of the second contact structure is greater than a width of the first contact structure.

16. The semiconductor device of claim 15, wherein the spacer structure includes a third spacer between the first spacer and the second spacer, and the first bottom surface of the first portion of the second contact structure is on a top surface of the third spacer.

17. The semiconductor device of claim 16, wherein the top surface of the third spacer is lower than at least one of the top surface of the second spacer and the top surface of the first contact structure.

18. The semiconductor device of claim 15, wherein the first bottom surface of the first portion of the second contact structure is lower than at least one of the top surface of the second spacer and the top surface of the first contact structure.

19. The semiconductor device of claim 16, wherein the spacer structure includes a fourth spacer between the first spacer and the second contact structure, and a bottom surface of the fourth spacer contacts the top surface of the third spacer.

20. The semiconductor device of claim 16, wherein the first bottom surface of the first portion of the second contact structure is convex, and the top surface of the third spacer is concave.

* * * * *